US010282509B2

(12) United States Patent
Watanabe et al.

(10) Patent No.: US 10,282,509 B2
(45) Date of Patent: May 7, 2019

(54) NON-TRANSITORY COMPUTER READABLE STORAGE MEDIUM, MASK EVALUATION METHOD AND INSPECTION APPARATUS

(71) Applicant: TOSHIBA MEMORY CORPORATION, Minato-ku (JP)

(72) Inventors: Yuki Watanabe, Yokohama (JP); Tetsuaki Matsunawa, Fujisawa (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 55 days.

(21) Appl. No.: 15/410,361

(22) Filed: Jan. 19, 2017

(65) Prior Publication Data
US 2018/0121592 A1 May 3, 2018

Related U.S. Application Data

(60) Provisional application No. 62/414,019, filed on Oct. 28, 2016.

(51) Int. Cl.
G06F 17/50 (2006.01)
G03F 1/36 (2012.01)
G03F 7/20 (2006.01)

(52) U.S. Cl.
CPC ............ G06F 17/5081 (2013.01); G03F 1/36 (2013.01); G03F 7/705 (2013.01); G03F 7/7065 (2013.01)

(58) Field of Classification Search
USPC ........................................................ 716/53
See application file for complete search history.

(56) References Cited

U.S. PATENT DOCUMENTS

| 8,490,034 | B1 | 7/2013 | Torunoglu et al. |
| 2008/0004852 | A1 | 1/2008 | Satake et al. |
| 2008/0077907 | A1* | 3/2008 | Kulkami ............... G03F 1/36 716/53 |
| 2008/0134131 | A1* | 6/2008 | Asano ................. G03F 7/70425 716/51 |

FOREIGN PATENT DOCUMENTS

| JP | 2007-324479 | 12/2007 |
| JP | 2008-122929 | 5/2008 |
| JP | 2010-97369 | 4/2010 |

* cited by examiner

Primary Examiner — Bryce M Aisaka
(74) Attorney, Agent, or Firm — Oblon, McClelland, Maier & Neustadt, L.L.P.

(57) ABSTRACT

A non-transitory computer readable storage medium according to an embodiment stores a mask evaluation program evaluating a mask used to manufacture an integrated circuit device. The program causes a computer to realize a convolutional neural network. The convolutional neural network output a calculated value of second data when first data is input. The first data corresponds to a circuit pattern of the mask. The second data corresponds to a pattern formed by the mask. The convolutional neural network has a filter and a weighting coefficient learned to reduce an error of the calculated value and an actual measured value of the second data by using the first data and the actual measured value of the second data.

20 Claims, 22 Drawing Sheets

CASE 1

CASE 2

NON-TRANSITORY COMPUTER READABLE STORAGE MEDIUM, MASK EVALUATION METHOD AND INSPECTION APPARATUS

CROSS-REFERENCE TO RELATED APPLICATIONS

This application is based upon and claims the benefit of priority from U.S. Provisional Patent Application 62/414,019, filed on Oct. 28, 2016; the entire contents of which are incorporated herein by reference.

FIELD

Embodiments relate to a non-transitory computer readable storage medium, a mask evaluation method and an inspection apparatus.

BACKGROUND

Conventionally, lithography is often used to manufacture an integrated circuit device. In lithography, a resist film is formed on a patterning material; an optical image of a circuit pattern is formed on the resist film by irradiating light onto the resist film via a mask in which the circuit pattern is formed; and the resist film is selectively exposed. Then, by developing the resist film after the exposure, the exposed portions of the resist film or the portions of the resist film not exposed are removed; and the resist pattern is formed. Thus, the circuit pattern of the mask is transferred onto the resist pattern. Then, the patterning material is patterned using the resist pattern as a mask.

However, because the optical image formed on the resist film and the resist pattern after the development do not always match due to various factors, it is necessary to design the circuit pattern of the mask to appropriately form the resist pattern. Therefore, in the design of the mask, a simulation is used to evaluate the resist pattern that will be formed using some circuit pattern of the mask.

DETAILED DESCRIPTION

A non-transitory computer readable storage medium according to an embodiment stores a mask evaluation program evaluating a mask used to manufacture an integrated circuit device. The program causes a computer to realize a convolutional neural network. The convolutional neural network output a calculated value of second data when first data is input. The first data corresponds to a circuit pattern of the mask. The second data corresponds to a pattern formed by the mask. The convolutional neural network has a filter and a weighting coefficient learned to reduce an error of the calculated value and an actual measured value of the second data by using the first data and the actual measured value of the second data.

First Embodiment

First, a first embodiment will be described.

<Method for Manufacturing Integrated Circuit Device>

A method for manufacturing an integrated circuit device using lithography will now be described.

Figure 1:
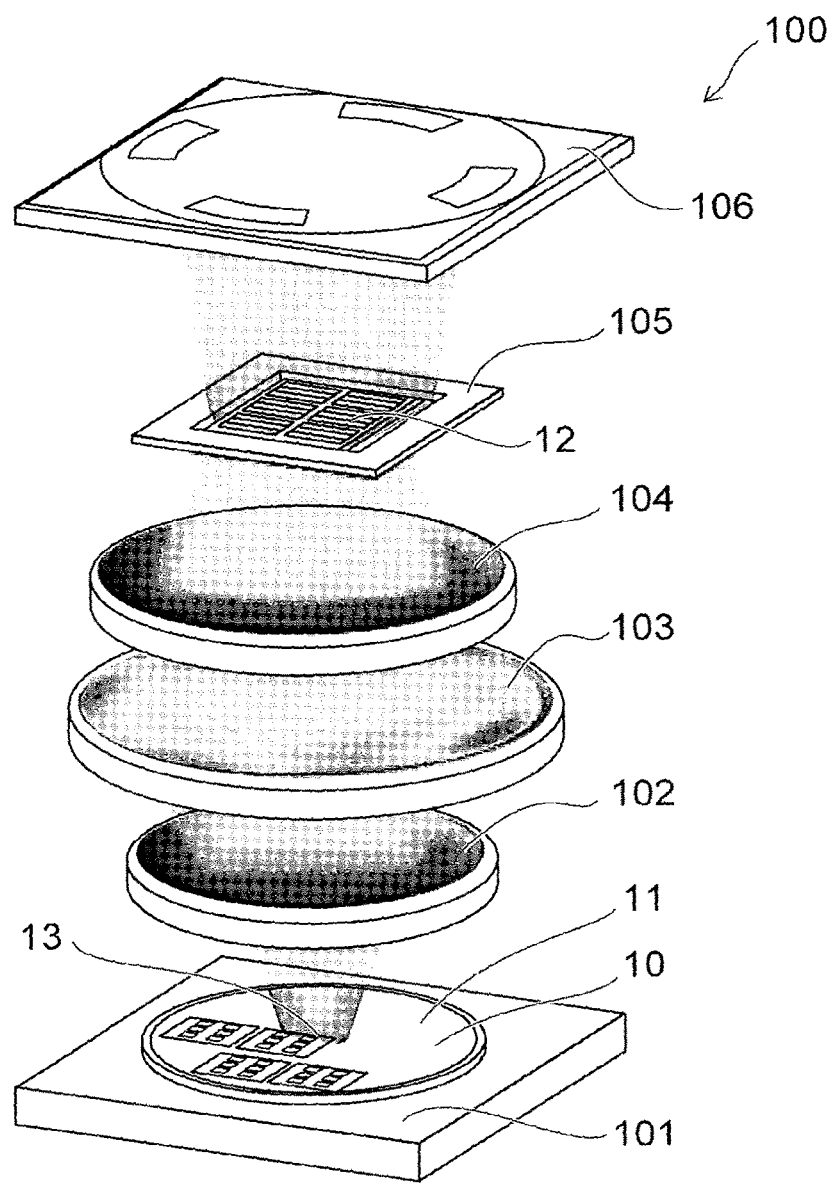
FIG. 1 is a drawing showing an exposure optical system of a first embodiment.

FIG. 1 is a drawing showing an exposure optical system of the embodiment.

In the exposure optical system 100 of the embodiment as shown in FIG. 1, a wafer 10 which is a patterning material is placed on a stage 101. The wafer 10 is, for example, a silicon wafer, a silicon wafer having an insulating film formed on the silicon wafer, a silicon wafer having a conductive film formed on the silicon wafer, etc. A resist film 11 is formed on the upper surface of the wafer 10. Lenses 102, 103, and 104 are provided above the wafer 10; and a mask holder 105 is provided above the lenses 102, 103, and 104. A mask 12 is mounted in the mask holder 105. A prescribed circuit pattern is formed in the mask 12. Illumination 106 is provided above the mask 12.

When the illumination 106 is turned on in the exposure optical system 100, light that is emitted from the illumination 106 selectively passes through the mask 12 and reaches the resist film 11 via the lenses 104, 103, and 102. Then, an optical image 13 that corresponds to the circuit pattern of the mask 12 is formed on the resist film 11. Thereby, the resist film 11 is selectively exposed.

Then, when the resist film 11 is developed, one of the exposed portions or the non-exposed portions of the resist film 11 are dissolved and removed; and the other of the exposed portions or the non-exposed portions remain. Thereby, a resist pattern 14 (referring to FIG. 2) is formed from the resist film 11. Then, when the wafer 10 is etched by using the resist pattern 14 as a mask, a post-patterning pattern 15 (referring to FIG. 2) is formed in the upper layer portion of the wafer 10. The integrated circuit device is manufactured by repeating such processes.

<Evaluation Method of Mask>

However, the circuit pattern of the mask 12 and the post-patterning pattern 15 formed in the wafer 10 no longer match each other as the circuit pattern of the integrated circuit device is downscaled. Therefore, it is favorable to predict the post-patterning pattern 15 at the design stage of the mask 12 and evaluate whether or not a defect 16 (referring to FIG. 2) will occur in the post-patterning pattern 15.

Figure 2:
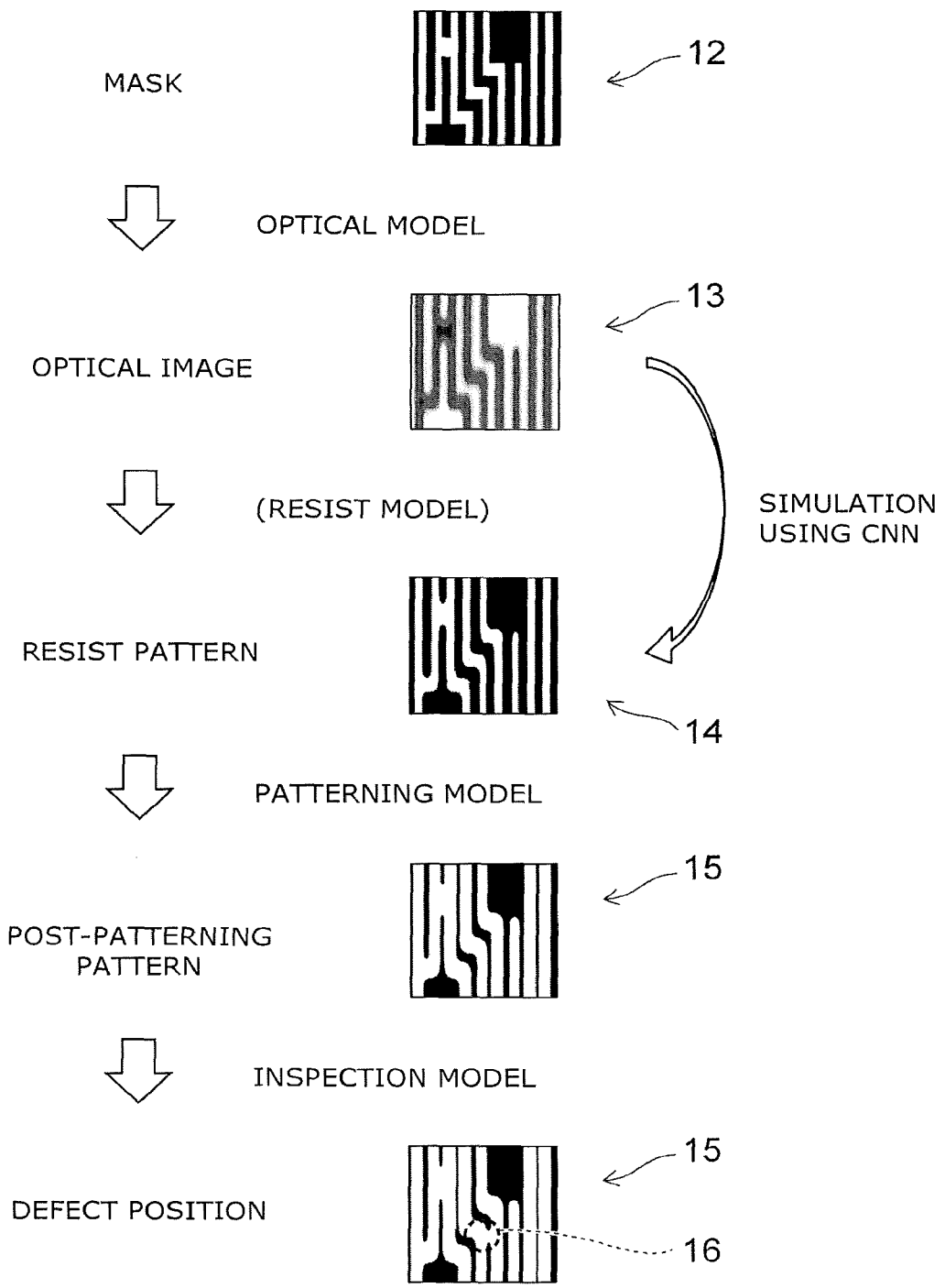
FIG. 2 is a figure showing an evaluation method of a mask according to the first embodiment.

FIG. 2 is a figure showing an evaluation method of the mask according to the embodiment.

As shown in FIG. 2, the mask 12 that has a circuit pattern is assumed. Normally, to simulate the optical image 13 imaged on the resist film 11 (referring to FIG. 1) from the mask 12, an optical model considering optical proximity correction (OPC), etc., is used. Normally, to simulate the resist pattern 14 from the optical image 13, a resist model that considers the diffusion behavior of the acid included in the developing liquid, the dissolution behavior of the resist film, etc., is used.

Normally, to simulate the post-patterning pattern 15 from the resist pattern 14, a patterning model that considers the behavior of the etching, etc., is used. To estimate the existence or absence of the defect 16 from the post-patterning pattern 15, an inspection model that considers the design rule, the circuit pattern, the characteristics of the inspection apparatus, etc., is used. The characteristics of the inspection apparatus include items such as whether the means used in the inspection is an optical microscope or SEM (a scanning electron microscope). By repeating such simulations, the post-patterning pattern 15 of the wafer 10 is estimated from the circuit pattern of the mask 12; and the existence or absence of the defect 16 is estimated.

Also, in the embodiment, a convolutional neural network (CNN) is used instead of a normal resist model when simulating the resist pattern 14 from the optical image 13.

FIG. 3A to FIG. 3E are figures showing a simulation method according to the embodiment.

Figure 3A:
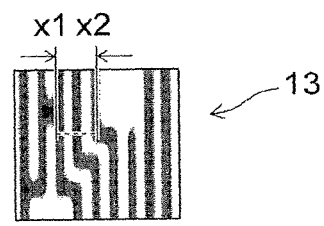
FIG. 3A to FIG. 3E are figures showing a simulation method according to the first embodiment.
Figure 3B:
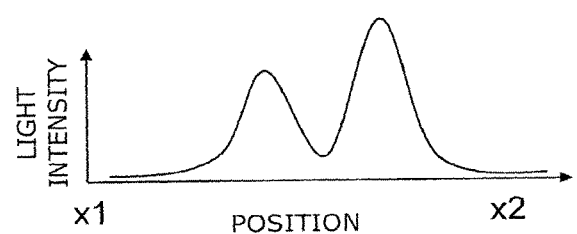
Figure 3C:
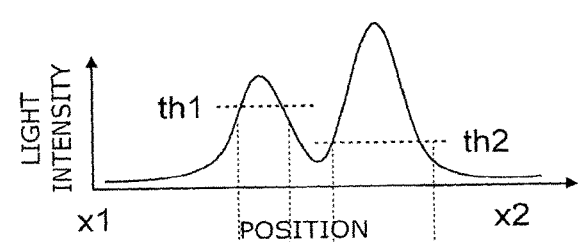
Figure 3D:
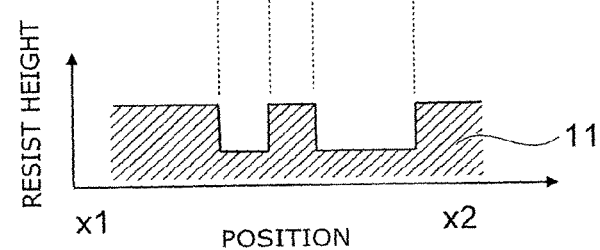
Figure 3E:
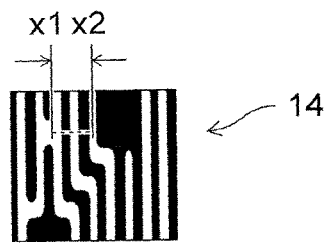

As shown in FIG. 3A, the optical image 13 that corresponds to the circuit pattern of the mask 12 is acquired. The intensity distribution of the light along line x1-x2 in the optical image 13 is taken to have a profile having two peaks having different heights as shown in FIG. 3B. As shown in FIG. 3C, a threshold th1 is applied to one peak of the profile; and a threshold th2 is applied to the other peak. As shown in FIG. 3D, for example, it is taken that the resist film 11 is dissolved and removed in the regions where the intensity of the light is higher than these thresholds, and the resist film 11 remains in the regions where the intensity of the light is lower than these thresholds. Thereby, as shown in FIG. 3E, the configuration of the resist pattern 14 can be estimated.

At this time, the thresholds (th1 and th2) that discriminate whether portions of the resist film remain or are removed are dependent on the circuit pattern, the exposure conditions, etc. Therefore, generally, the threshold th1 and the threshold th2 are different from each other even within the same optical image 13. Because the outer edge of the resist pattern 14 is specified using the thresholds, the configuration of the resist pattern 14 cannot be predicted accurately unless the thresholds are set appropriately. However, because the thresholds are affected by various factors, it is difficult to determine appropriate thresholds by an analytical method.

Therefore, in the embodiment, the thresholds are determined by using a convolutional neural network.

Figure 4:
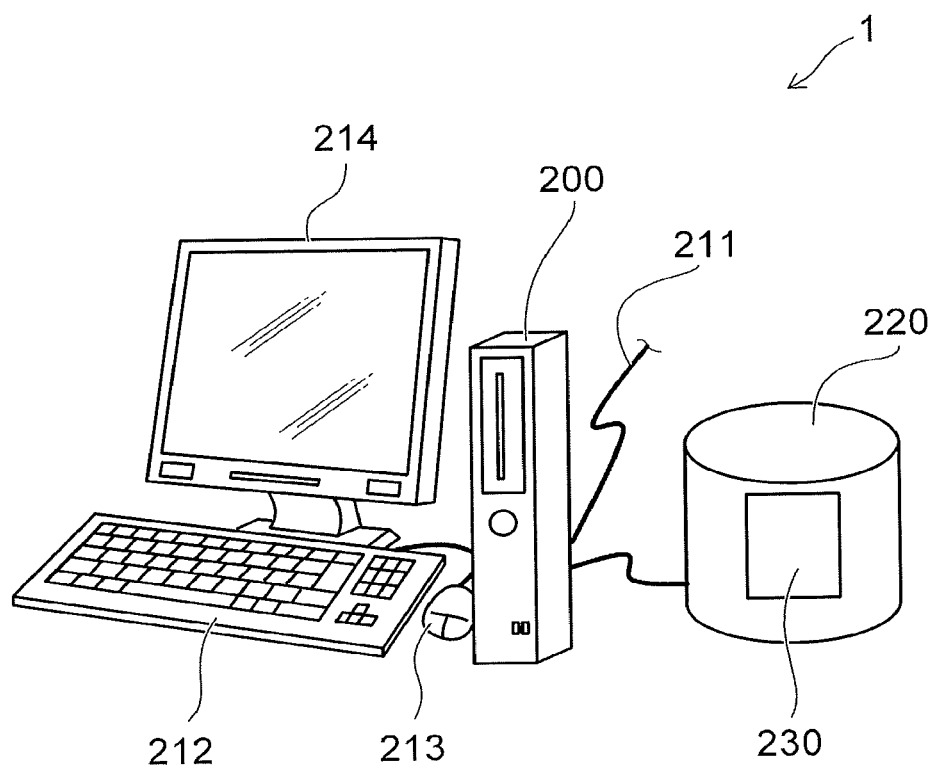
FIG. 4 is a drawing showing an evaluation system of the mask according to the first embodiment.

FIG. 4 is a drawing showing an evaluation system of the mask according to the embodiment.

As shown in FIG. 4, a computer 200 is provided in the evaluation system 1 of the mask according to the embodiment. Input/output units such as a LAN terminal 211, a keyboard 212, a mouse 213, a monitor 214, etc., and a memory unit 220 such as a hard disk drive, CD-ROM (Compact Disc Read Only Memory), or DVD (Digital Versatile Disk), etc., are connected to the computer 200. The memory unit 220 is a non-transitory computer readable storage medium storing a mask evaluation program 230. The memory unit 220 may be built into the computer 200. The mask evaluation program 230 is stored in the memory unit 220. The mask evaluation program 230 is a program that causes the computer 200 to realize the convolutional neural network (CNN) 20 shown in FIG. 5.

A method for calculating the threshold of the optical image will now be described.

Figure 5:
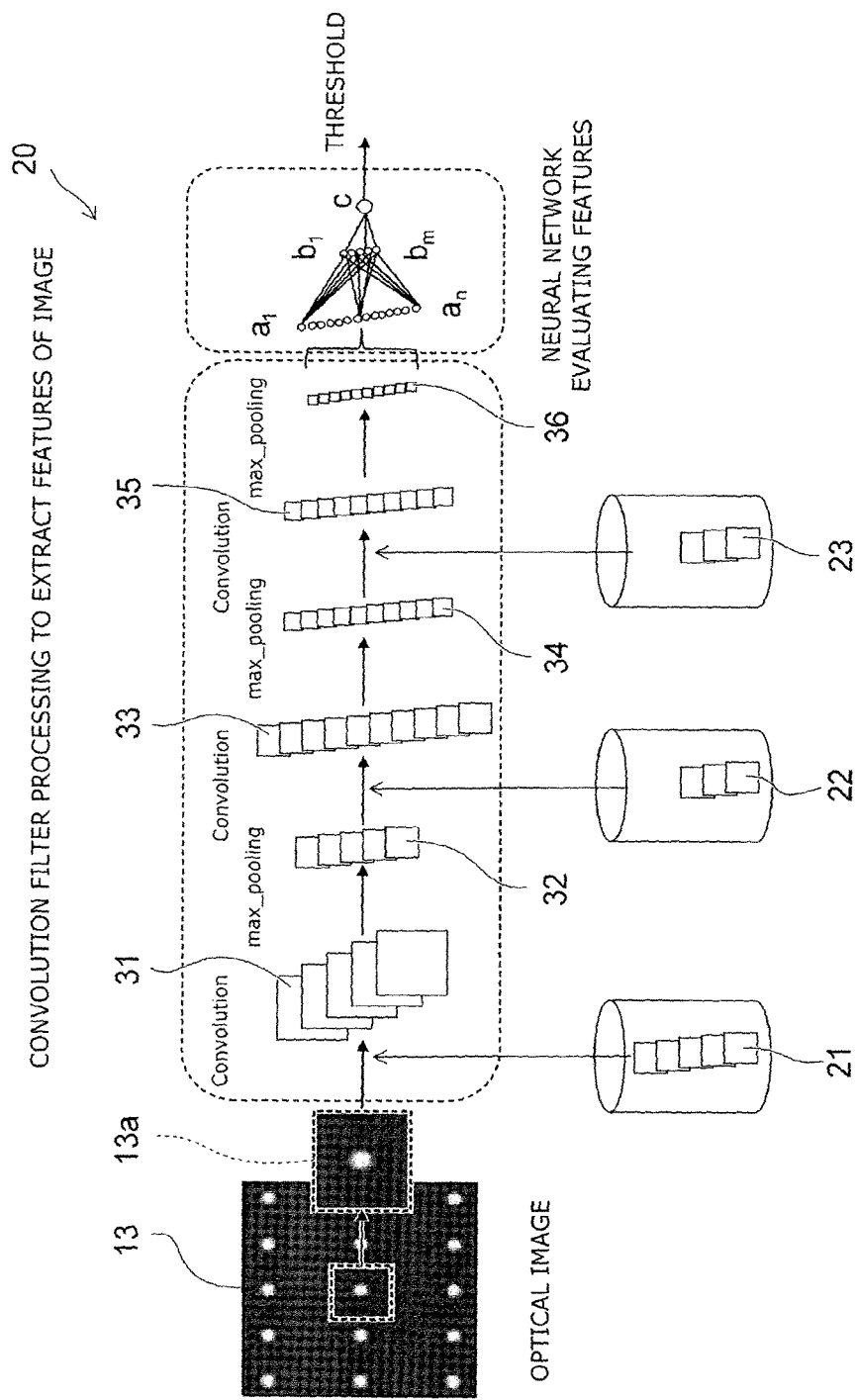
FIG. 5 is a drawing showing a method for calculating a threshold according to the first embodiment.

FIG. 5 is a drawing showing the method for calculating the threshold according to the embodiment.

Figure 6A:
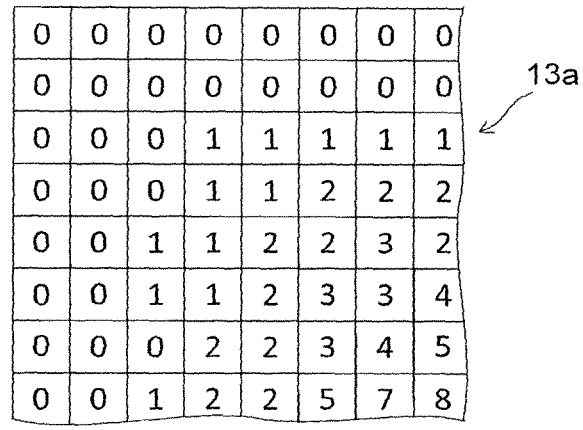
FIG. 6A is a figure showing a data example of one portion of an optical image.
Figure 6B:
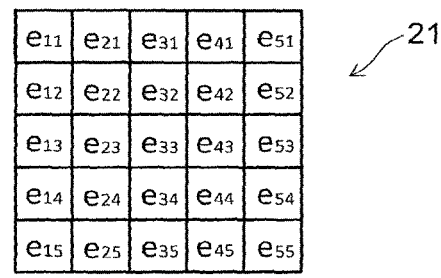
FIG. 6B is a figure showing an example of a filter.
Figure 6C:
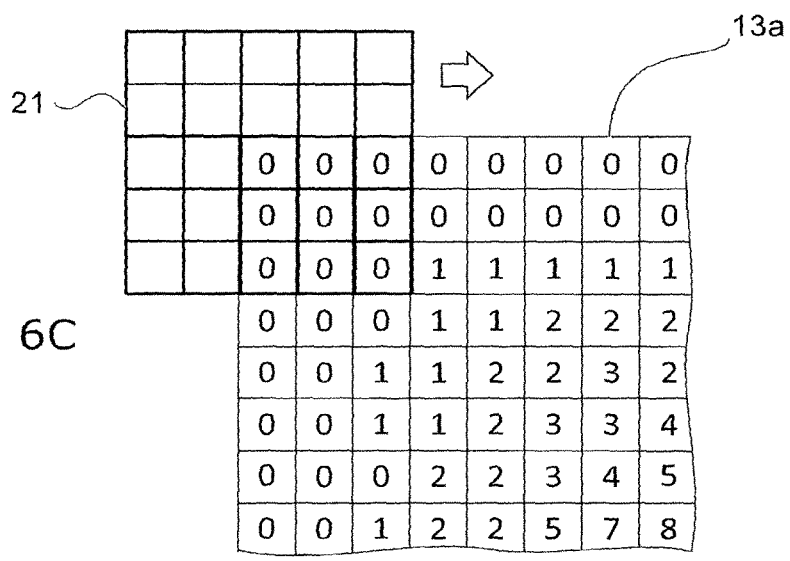
FIG. 6C is a figure showing a convolution filter processing for the one portion of the optical image.

FIG. 6A is a figure showing a data example of the one portion of the optical image; FIG. 6B is a figure showing an example of the filter; and FIG. 6C is a figure showing the convolution filter processing for the one portion of the optical image.

Figure 7A:
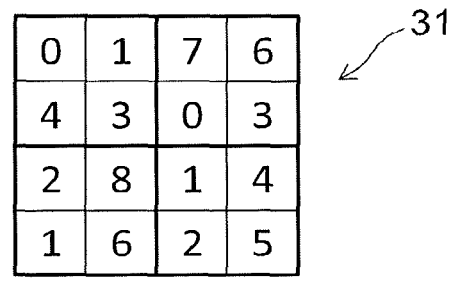
FIG. 7A is a figure showing a map prior to a compression.
Figure 7B:
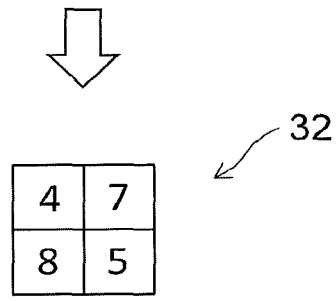
FIG. 7B is a figure showing a reduced map after the compression.

FIG. 7A is a figure showing a map prior to the compression; and FIG. 7B is a figure showing a reduced map after the compression.

First, as shown in FIG. 5, an input image 13a is acquired from the optical image 13. The input image 13a may be a cut out portion of the optical image 13 or may be the entire optical image 13. The input image 13a is set to be, for example, the image of a region including a region where the threshold of the optical image 13 is to be predicted and applied and is set to be, for example, the image of a region having a constant size and having the position where the threshold is to be predicted and applied as the center. Then, the pixel value data of the input image 13a is input to the CNN 20.

The CNN 20 performs convolution filter processing of the input image 13a.

The convolution filter processing will now be described briefly.

As shown in FIG. 6A, for example, a numerical value (a pixel value) that represents the intensity of the light of each pixel is recorded in the data of the input image 13a. On the other hand, as shown in FIG. 6B, a filter 21 is, for example, a collection of numerical values arranged in a (5×5) matrix configuration. The size of the filter 21 is not limited to (5×5) and may be, for example, (3×3). Numerical values $e_{11}$ to $e_{55}$ that are used as operators are assigned to the rectangles of the filter 21.

Then, as shown in FIG. 6C and Formula 1 recited below, the filter 21 is overlaid on the input image 13a; and the sum total of the product of the operators and the pixel values of the corresponding rectangles are calculated, added to an offset component, and used as the feature.

$$\text{output}_{ij} = \sum_{y=0}^{kernel\_size} \sum_{x=0}^{kernel\_size} (\text{input}_{i+x, j+y} \cdot \text{kernel}_{xy}) + \text{offset} \qquad [\text{Formula 1}]$$

Then, for example, the filter 21 is moved one rectangle in the horizontal direction with respect to the input image 13a; and the feature is calculated by performing the same calculation. The stride length of the filter 21 is not limited to one rectangle and may be two or more rectangles. A map 31 is made by repeating the processing described above for each pixel of the input image 13a, converting the calculated features using an activation function, and arranging the values after the conversion in a planar configuration. An example of the activation function is shown in Formula 2 recited below.

$$y = \max(0, x) \qquad [\text{Formula 2}]$$

Thus, one map 31 is made for one filter 21. Therefore, based on one input image 13a, the number of the maps 31 that are made is the number of the filters 21. For example, in the Embodiment, 50 to 100 maps 31 are made using 50 to 100 filters 21. In the case where multiple input images 13a are processed, the filters 21 may be prepared for each input image. For example, in the case where twenty maps 31 are made from ten input images, 10×20=200 filters 21 may be prepared. However, the number of the filters 21 is arbitrary.

Then, a reduced map 32 is made by compressing the map 31. For example, the compression of the map 31 is performed by Max Pooling. In other words, the map 31 is divided into multiple regions; and the maximum value of each region is used as the value of that region.

For example, the four numerical values of "0," "1," "4," and "3" are included in the (2×2) region on the upper left of the illustration of the map 31 shown in FIG. 7A. Because the maximum numerical value is "4," the value of the rectangle on the upper left of the illustration in the reduced map 32 shown in FIG. 7B is set to 4. The maximum value is calculated similarly for the other (2×2) regions. Thus, the same number of reduced maps 32 as maps 31 are made.

Then, as shown in FIG. 5, a map 33 is made for each reduced map 32 by performing convolution filter processing using a filter 22. In the embodiment, the number of the filters 22 at this stage is, for example, 10. The number of the maps 33 is arbitrary.

Then, for example, a reduced map 34 is made by compressing the map 33 by Max Pooling. The number of the reduced maps 34 is the same as the number of the maps 33.

Then, a map 35 is made for the reduced map 34 by performing convolution filter processing using a filter 23. In the embodiment, the number of the filters 23 at this stage is, for example, 10. The number of the maps 35 is arbitrary.

Then, for example, a reduced map 36 is made by compressing the map 35 by Max Pooling. The number of the reduced maps 36 is the same as the number of the maps 35.

Thus, for the input image 13a, convolution filter processing and compression are repeated alternately three times each.

Then, the pixel values of the multiple reduced maps 36 all are extracted and used as n numerical values $a_1$ to $a_n$. Then, m numerical values $b_1$ to $b_m$ are generated from the n numerical values $a_1$ to $a_n$ by using a neural network. A weighting coefficient k is assigned respectively between the numerical values $a_1$ to $a_n$ and the numerical values $b_1$ to $b_m$. For example, the numerical value $b_3$ can be represented as in Formula 3 recited below, where i is an integer from 1 to n, j is an integer from 1 to m, and offset1 is the offset component. There are also cases where the coefficient $k_{ij}$ is 0.

$$b_j = \sum_{i=1}^{n} (k_{ij} \times a_i) + \text{offset1} \qquad [\text{Formula 3}]$$

Then, one numerical value c is generated from the m numerical values $b_1$ to $b_m$ by using a neural network. A weighting coefficient $l_j$ is assigned respectively between the numerical value c and the numerical values $b_1$ to $b_m$. For example, the numerical value c can be represented as in Formula 4 recited below, where offset2 is the offset component. There are also cases where the coefficient $l_j$ is 0.

$$c = \sum_{j=1}^{m} (l_j \times b_j) + \text{offset2} \qquad [\text{Formula 4}]$$

The numerical value c is the threshold for the input image 13a. Thus, the threshold of the input image 13a is estimated.

Other than providing one datum in the final layer, the structure of the neural network can be selected freely. For example, the number m of the numerical values b may be less than, equal to, or greater than the number n of the numerical values a. Also, a linear function other than Formula 3 and Formula 4 recited above may be used; or a nonlinear function may be used.

Thresholds of multiple levels are necessary according to the optical image 13. For example, there are cases where independent thresholds are necessary for each pixel or for each region of the optical image 13. In such a case, the multiple input images 13a corresponding to each pixel or each region are selected; and the thresholds are determined respectively for the multiple input images 13a.

<Method for Making Convolutional Neural Network>

A method for making the CNN 20 described above will now be described.

Figure 8:
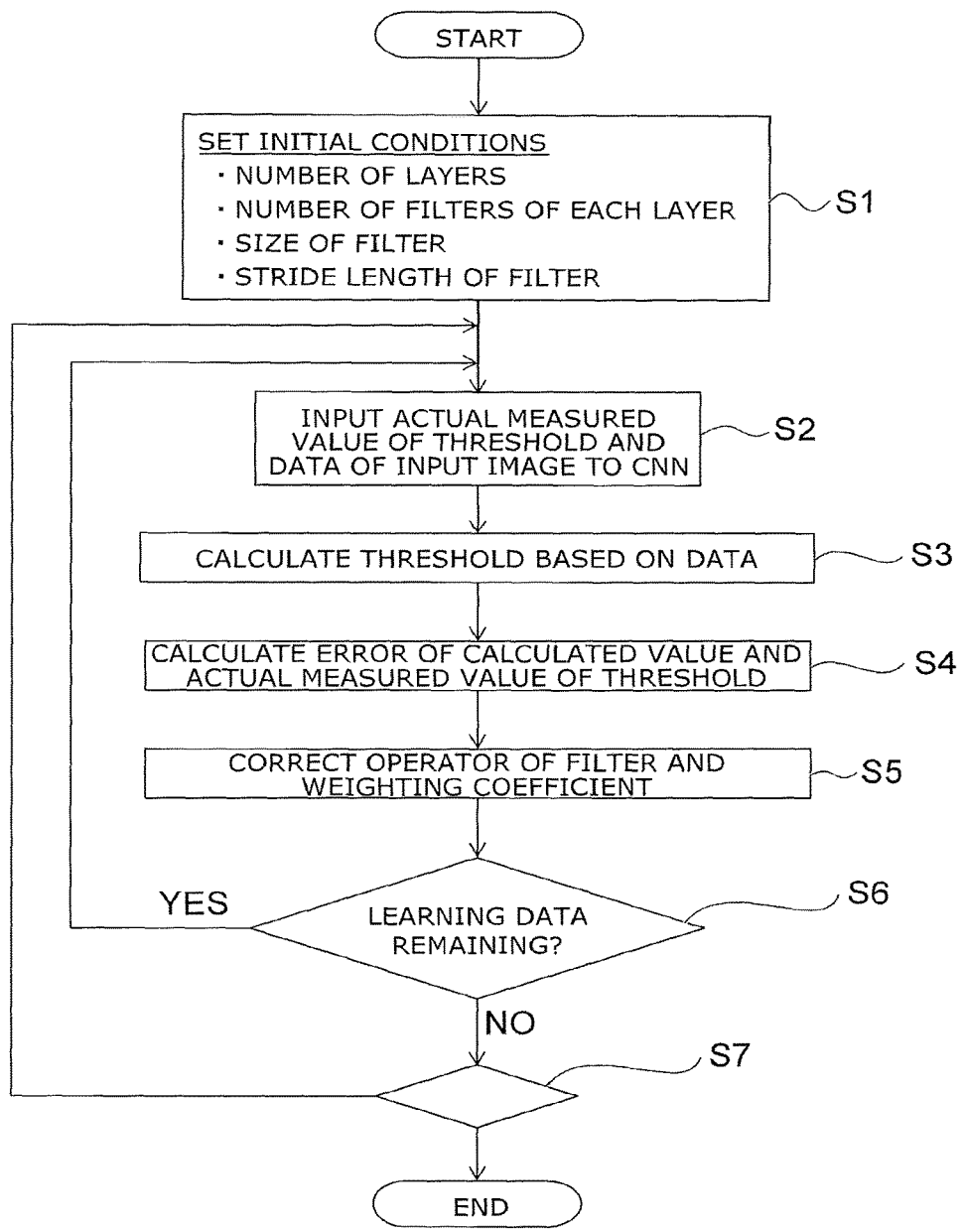
FIG. 8 is a flowchart showing a method for making a CNN according to the first embodiment.

FIG. 8 is a flowchart showing the method for making the CNN according to the embodiment.

First, the initial conditions are set as shown in step S1 of FIG. 8. The items that are set as the initial conditions are the number of layers of the filter processing, the number of filters in each layer, the size of each filter, and the stride length of the filter in the convolution. In the example described above, the number of layers of the filter processing is three. The number of layers may be three or more and may be, for example, 10 to 100. Also, in the example described above, the number of filters in each layer is 50 to 100 for the filter 21 of the first layer, 10 for the filter 22 of the second layer, and 10 for the filter 23 of the third layer. In the example described above, the size of each of the filters 21 to 23 is (5×5). In the example described above, the stride length of the filter is one rectangle.

Conversely, the initial values of the operators $e_{11}$ to $e_{55}$ of each filter and the initial values of the weighting coefficients $k_{ji}$ and $l_j$ are determined automatically. For example, all may be set to 1; or the initial values may be set randomly.

Then, as shown in step S2, the data of one input image 13a corresponding to the optical image 13 and the actual measured value of an appropriate threshold of the input image 13a are input to the CNN 20 as learning data. The actual measured value of the threshold is a value obtained by actually exposing and developing the resist film.

Thereby, as shown in step S3, the computer calculates the threshold based on the data of the input image 13a by the method described above. Some synapses of the neural network may be severed intentionally.

Then, as shown in step S4, the computer compares the actual measured value and the calculated value of the threshold and calculates the error between the actual measured value and the calculated value.

Then, as shown in step S5, the operators $e_{11}$ to $e_{55}$ of each filter and the offset component offset, and the weighting coefficients l and k, and the offset components offset1 and offset2 are corrected to reduce the error by solving backward from the error by using backpropagation. For example, the Gauss-Newton method, a steepest descent method, etc., may be used for the correction.

Then, the flow proceeds to step S6; and if learning data, i.e., a set of the data of another input image 13a of the optical image 13 and the actual measured value of the threshold of the data, that has not yet been input to the CNN 20 remains, the flow returns to step S2; and the machine learning shown in steps S2 to S5 is executed. Then, based on the new learning data, the operators $e_{11}$ to $e_{55}$ of each filter and the offset component offset, and the weighting coefficients l and k, and the offset components offset1 and offset2 are corrected to reduce the error between the calculated value and the actual measured value of the threshold.

Thus, the operators $e_{11}$ to $e_{55}$ of each filter and the offset component offset, and the weighting coefficients l and k, and the offset components offset1 and offset2 are caused to approach the optimal values by repeating the machine learning by using the learning data of, for example, 100 to 1000 sets. Thereby, the filters and the weighting coefficients are improved to be able to output the threshold of the learning data when the optical image of the learning data is input.

Then, after all of the learning data is used, the flow proceeds to step S7; and the processes shown in steps S2 to S6 are repeated. In other words, the learning is performed by repeatedly using the set of the same learning data multiple times. Thereby, the filters and the weighting coefficients are corrected more appropriately. At this time, for example, in the case where 1000 sets of learning data are used, the 1000 sets of learning data may be subdivided into, for example, 10 groups made of 100 sets of data; and the correction processing may be performed for each group. Such a method generally is called "minibatch."

As a result, the CNN 20 that is practically and sufficiently usable is made. In other words, when the input image 13a for which the threshold is unknown is input to the CNN 20, the appropriate threshold for the input image 13a is output by using the calculation described above. Thus, the CNN 20 that is made is applicable even if the circuit pattern of the mask 12 is modified. However, it is favorable to re-make the CNN 20 if the generation of the integrated circuit device to be used is changed, the design rule is modified, or the material of the resist is modified.

<Effects>

Effects of the embodiment will now be described.

According to the mask evaluation system 1 according to the embodiment as shown in FIG. 2, the threshold of the light intensity discriminating whether the resist film remains or is removed can be estimated based on the optical image 13 imaged by the mask 12. Thereby, the configuration of the resist pattern 14 can be simulated. Then, by applying the patterning model to the resist pattern 14, the post-patterning pattern 15 can be simulated. Also, by applying the inspection model to the post-patterning pattern 15, the existence or absence of the defect 16 can be estimated. Thus, it can be evaluated whether or not the defect 16 will occur in the mask 12 without actually exposing and developing the resist film 11 and patterning the wafer 10; and the design of the mask 12 is easy.

Also, the mask evaluation system 1 according to the embodiment uses the CNN 20 in which the learning is performed by using the set made of the input image 13a and the actual measured value of the threshold. Therefore, the content of the filters and the weighting coefficients of the neural network of the CNN 20 are adjusted automatically so that the calculated value of the threshold approaches the actual measured value. As a result, the threshold can be calculated with high precision.

Also, when making the CNN 20, it is sufficient to determine only formal requirements such as the number of layers, the number of filters of each layer, the size of each filter, and the stride length of the filter as the initial conditions; and, for example, it is unnecessary to perform arbitrary determinations about real content such as the features that should be selected as the parameters of the simulation. Therefore, the content of the CNN 20 does not change due to the determination of the creator; and the stability is high. Accordingly, the stability of the mask evaluation system 1 according to the embodiment is high.

On the other hand, in a method for simulating the resist pattern 14 from the optical image 13 by using a conventional resist model, when the circuit pattern is downscaled and becomes more complex, there are cases where the simulation does not work well regardless of the value to which the threshold is set. In such a case, it is necessary to divide the optical image 13 into multiple portions and set the threshold for each portion. In such a case, as the method for estimating the threshold of each portion, for example, there is a method in which the maximum value, the minimum value, the gradient, etc., of the light intensity distribution of the optical image are extracted as the features; a regression is performed using these features and the actual measured value of the threshold; the relational expression between the features and the threshold is derived; and the features are fitted to the relational expression.

However, in this method, because it is necessary to arbitrarily determine the types of the features and the format of the relational expression, the appropriate features and relational expression cannot always be selected; and a simulation model having high precision cannot always be constructed. For example, it is unclear whether or not the maximum value, the minimum value, and the gradient of the light intensity are appropriate as the features used in the simulation; and it is unclear whether or not a polynomial is appropriate as the relational expression. Also, only features that are easily recognized by a human such as the maximum value, the minimum value, and the gradient of the light intensity, etc., are extracted when extracting the features from the optical image; therefore, only a very small portion of the information included in the optical image can be utilized; and generally, the precision of the simulation is low.

Conversely, according to the embodiment, a large number of sets of the optical image and the actual measured value of the threshold of the optical image are prepared; and machine learning of the CNN 20 is performed by using the sets as the learning data. Therefore, the information that is included in the optical image and includes even features not recognized by a human can be utilized sufficiently. As a result, the threshold can be predicted with high precision based on the optical image.

Although an example is shown in the embodiment in which the pixel value of each pixel is used as the data of the input image 13a, this is not limited thereto. For example, data in which the coordinate system of the pixel values is converted by a Fourier transform, a wavelet transformation, etc., may be used as the data of the input image 13a.

Second Embodiment

A second embodiment will now be described.

Figure 9:
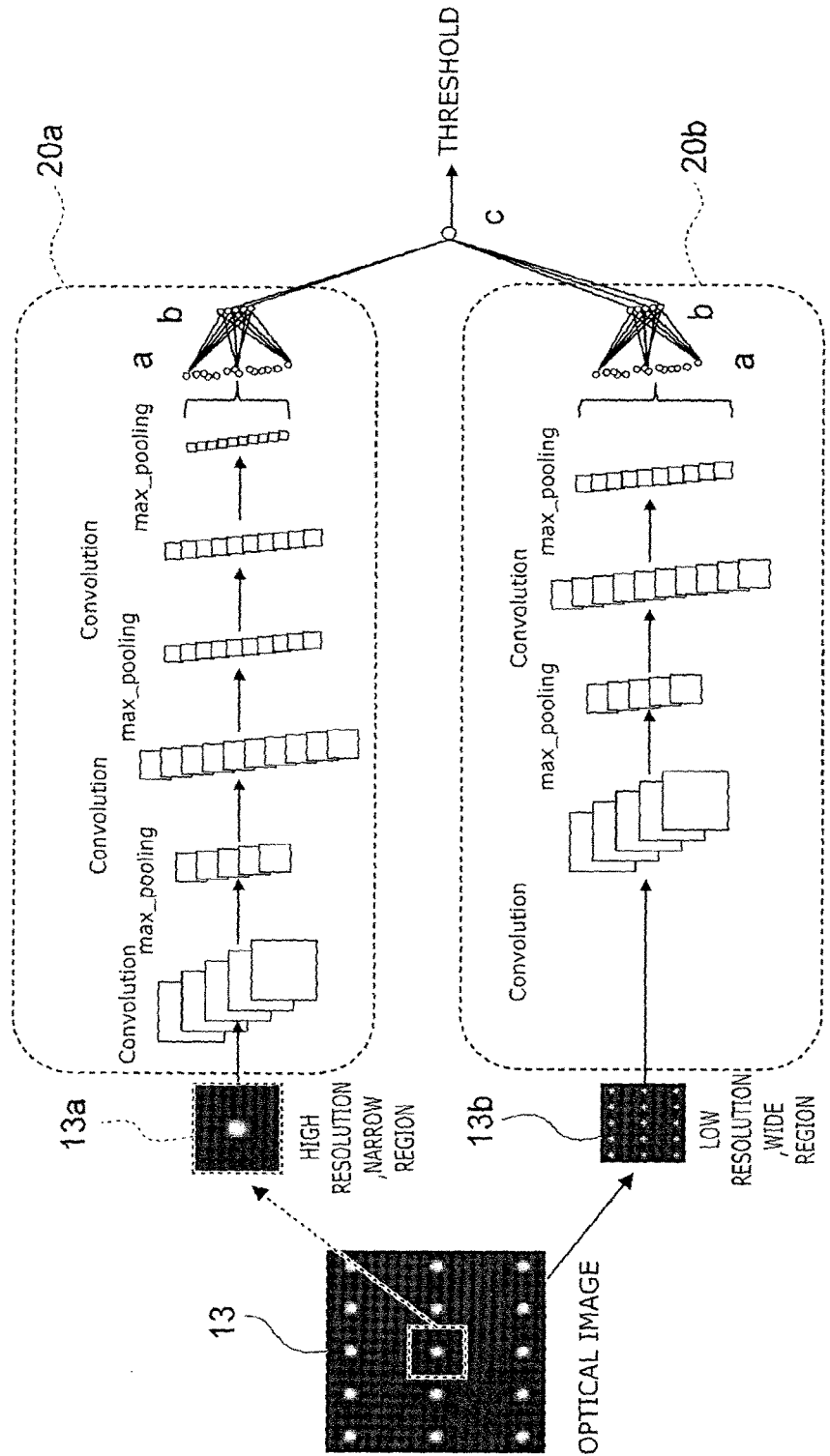
FIG. 9 is a drawing showing a method for calculating a threshold according to a second embodiment.

FIG. 9 is a drawing showing a method for calculating the threshold according to the embodiment.

The filters 21 to 23 are not illustrated in FIG. 9.

As shown in FIG. 9, the mask evaluation program according to the embodiment causes the computer 200 (referring to FIG. 4) to realize a CNN 20a and a CNN 20b. Although the CNN 20a and the CNN 20b perform processing similar to that of the CNN 20 of the first embodiment described above, the CNN 20a and the CNN 20b integrate the output of the CNN 20a and the output of the CNN 20b in the final stage, and generate and output one numerical value c. The numerical value c is the threshold of the input image 13a. A multistage neural network may be used as the method for integrating the output.

The method for calculating the threshold of the embodiment will now be described.

In the embodiment as shown in FIG. 9, the input image 13a and an input image 13b are extracted from the optical image 13. The resolution of the input image 13a is different from the resolution of the input image 13b. For example, compared to the input image 13a, the corresponding region of the input image 13b is wide and has a low resolution. For example, the input image 13b includes a region corresponding to the input image 13a.

Then, the input image 13a is input to the CNN 20a. Also, the input image 13b is input to the CNN 20b. Thereby, the CNN 20a calculates the multiple numerical values b; and the CNN 20b calculates the multiple numerical values b. Then, the numerical value c, i.e., the threshold of the input image 13a, is calculated based on the numerical values b calculated by the CNN 20a and the numerical values b calculated by the CNN 20b.

In lithography, for example, there are cases where the periodicity of the circuit pattern in a wide area affects the local exposure due to interference, etc. According to the embodiment, the threshold can be calculated more accurately by considering an input image 13b corresponding to a wider region in addition to the input image 13a including the region where the threshold is to be applied.

Otherwise, the configuration, the calculation method, the method for making the CNN, and the effects of the embodiment are similar to those of the first embodiment described above.

Although an example is shown in the embodiment in which the two types of the input images of the input images 13a and 13b extracted from the optical image 13 and having mutually-different resolutions are used, this is not limited thereto. For example, three or more types of input images having mutually-different resolutions may be used. Also, the multiple input images may be different types of images. For example, the images may be images of an optical image and a mask pattern.

Third Embodiment

A third embodiment will now be described

Figure 10:
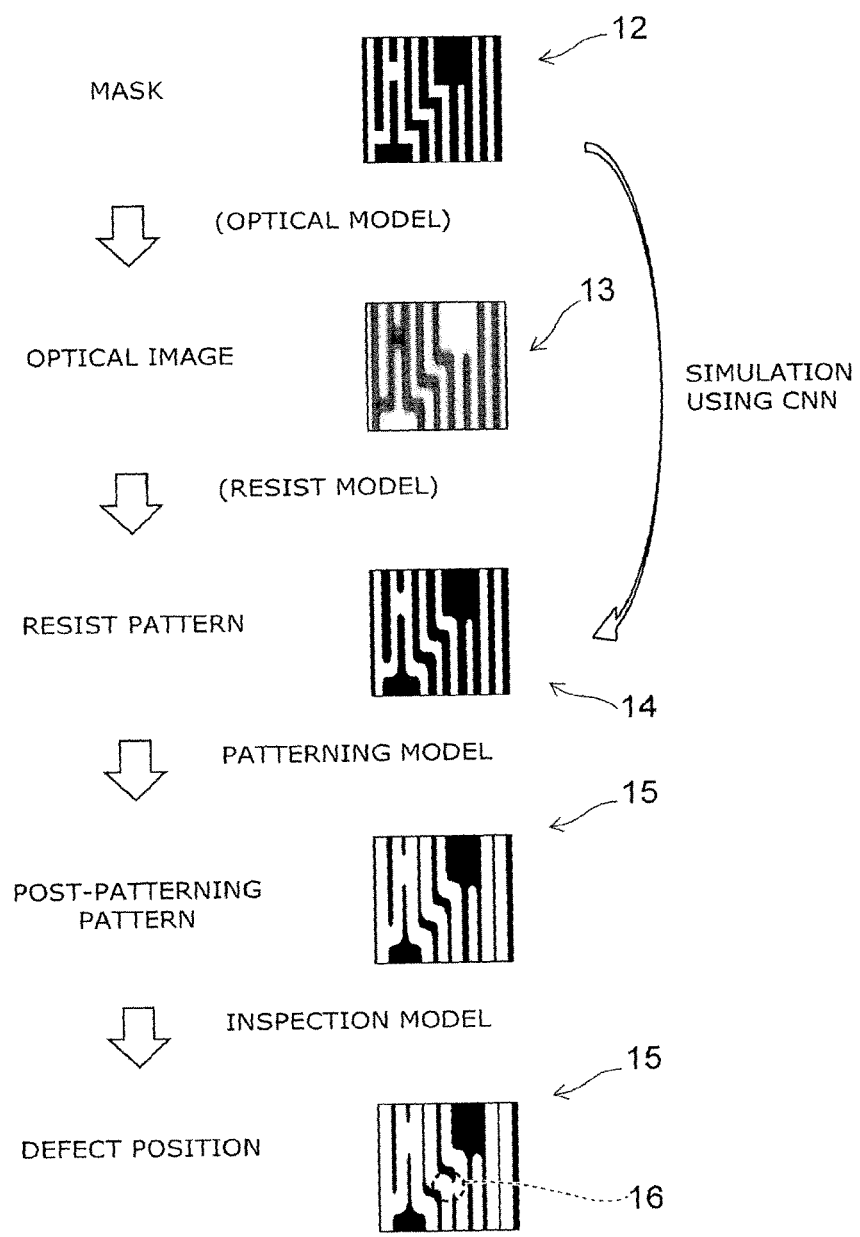
FIG. 10 is a drawing showing an evaluation method of a mask according to a third embodiment.

FIG. 10 is a drawing showing an evaluation method of the mask according to the embodiment.

Figure 11:
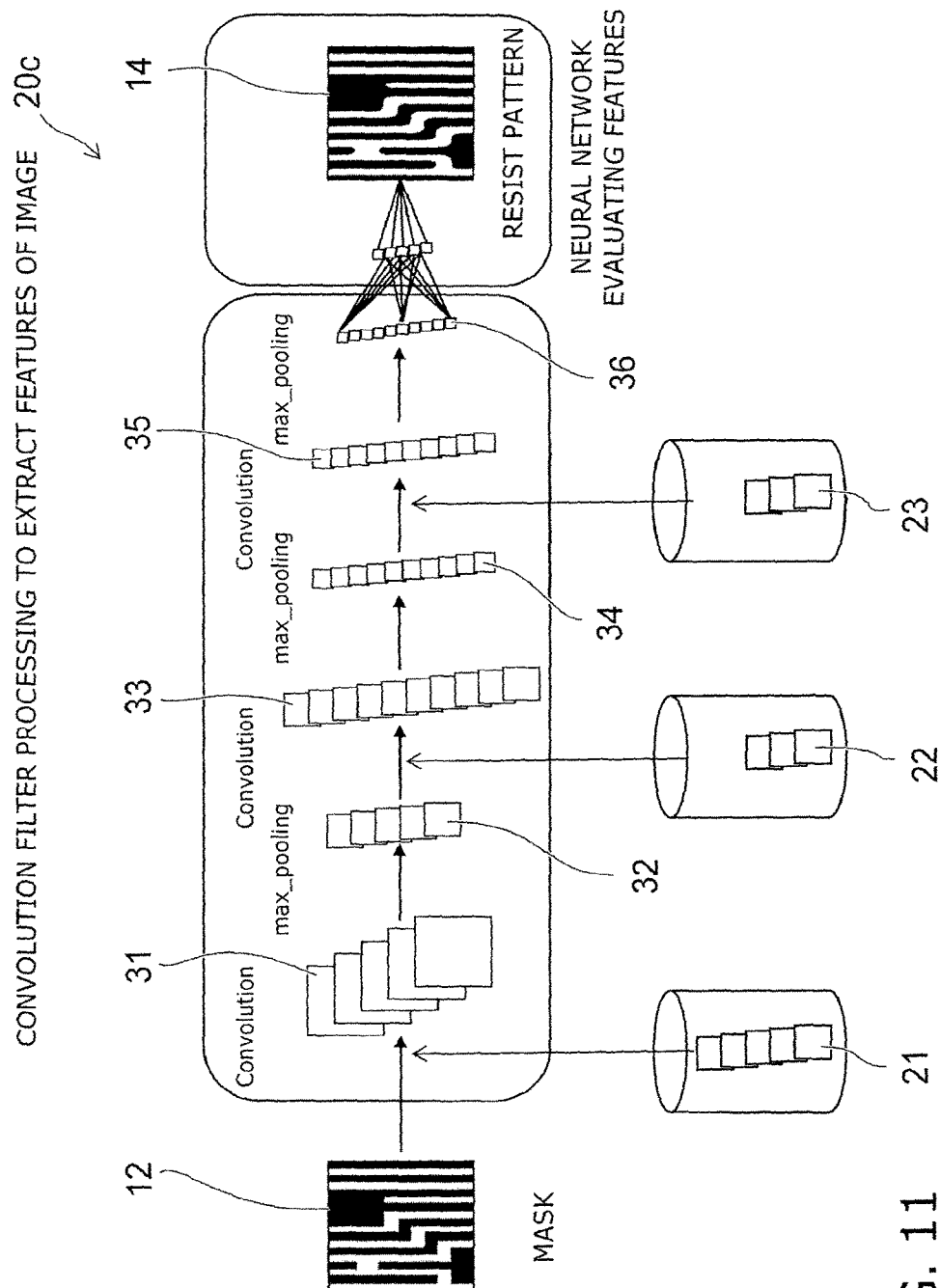
FIG. 11 is a drawing showing a method for calculating a resist pattern according to the third embodiment.

FIG. 11 is a drawing showing a method for calculating the resist pattern according to the embodiment.

In the mask evaluation system according to the embodiment as shown in FIG. 10, the resist pattern 14 is simulated directly from the mask 12 without using the simulation of the optical image 13 using the optical model and the simulation of the resist pattern 14 using the resist model.

In the embodiment as shown in FIG. 11, data representing the circuit pattern of the mask 12 is input to a CNN 20c. Then, the multiple reduced maps 36 are made by a method similar to that of the first embodiment described above. Then, the resist pattern 14 is made by providing weighting to the multiple reduced maps 36 and synthesizing the multiple reduced maps 36 by the neural network. Thus, the resist pattern 14 is estimated from the mask 12.

A method for making the CNN 20c according to the embodiment will now be described.

Figure 12:
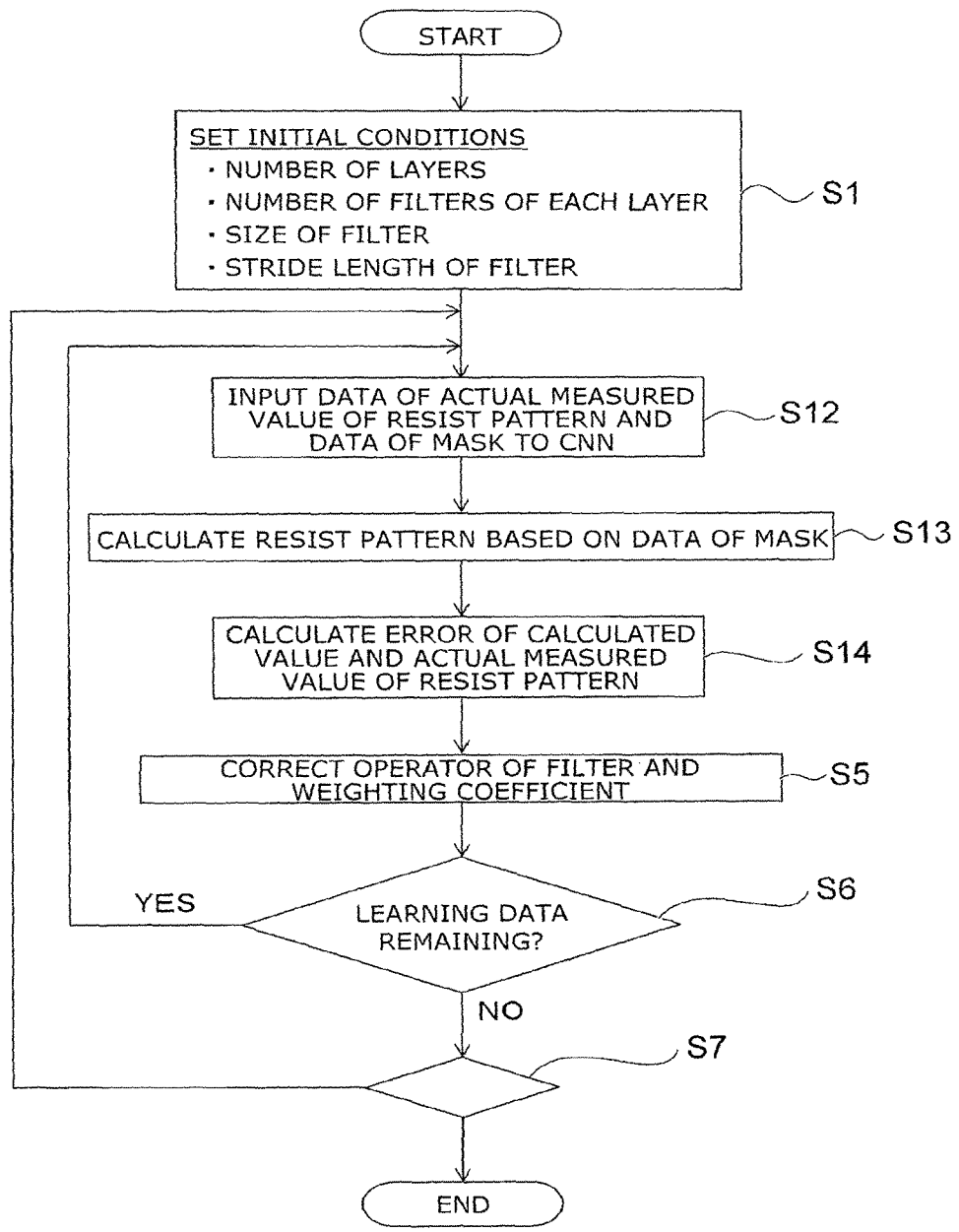
FIG. 12 is a flowchart showing a method for making a CNN according to the third embodiment.

FIG. 12 is a flowchart showing the method for making the CNN according to the embodiment.

As shown in step S1 of FIG. 12, first, the initial conditions are set. The items of the initial conditions are similar to those of the first embodiment described above.

Then, as shown in step S12, as the learning data, the data of the circuit pattern of the mask 12 and the actual measured value of the data of the resist pattern 14 are input to the CNN 20c. The actual measured value of the data of the resist pattern 14 is the measured and quantified configuration data of the resist pattern 14 actually formed by exposing and developing the resist film 11 (referring to FIG. 3D) by using the mask 12.

Then, as shown in step S13, the computer calculates the configuration of the resist pattern 14 by using the CNN 20c based on the data of the mask 12.

Then, as shown in step S14, the computer compares the actual measured value and the calculated value of the resist pattern 14 and calculates the error between the actual measured value and the calculated value.

Then, as shown in step S5, similarly to the first embodiment described above, the weighting coefficients l and k and the operators $e_{11}$ to $e_{55}$ of each filter and the offset component offset are corrected to reduce the error by backpropagation.

Then, the flow proceeds to step S6; and if learning data that is not yet input to the CNN 20a remains, the flow returns to step S12; and the machine learning shown in steps S12 to S15 is executed. Then, the weighting coefficients l and k and the operators $e_{11}$ to $e_{55}$ of each filter and the offset component offset are corrected to reduce the error of the calculated value and the actual measured value of the threshold based on the new learning data. Then, when all of the learning data has been used, the flow proceeds to step S7; and the machine learning using all of the learning data is repeated. At this time, a minibatch method may be employed. Thus, the CNN 20c is made.

Effects of the embodiment will now be described.

According to the embodiment, the resist pattern 14 can be simulated directly from the mask 12 without performing the simulation of the optical image 13 using the optical model and the simulation of the resist pattern 14 using the resist model. Therefore, compared to the first embodiment described above, the evaluation of the mask 12 is simple; and the design of the mask 12 can be more efficient.

Otherwise, the configuration, the calculation method, the method for making the CNN, and the effects of the embodiment are similar to those of the first embodiment described above.

Fourth Embodiment

A fourth embodiment will now be described.

Figure 13:
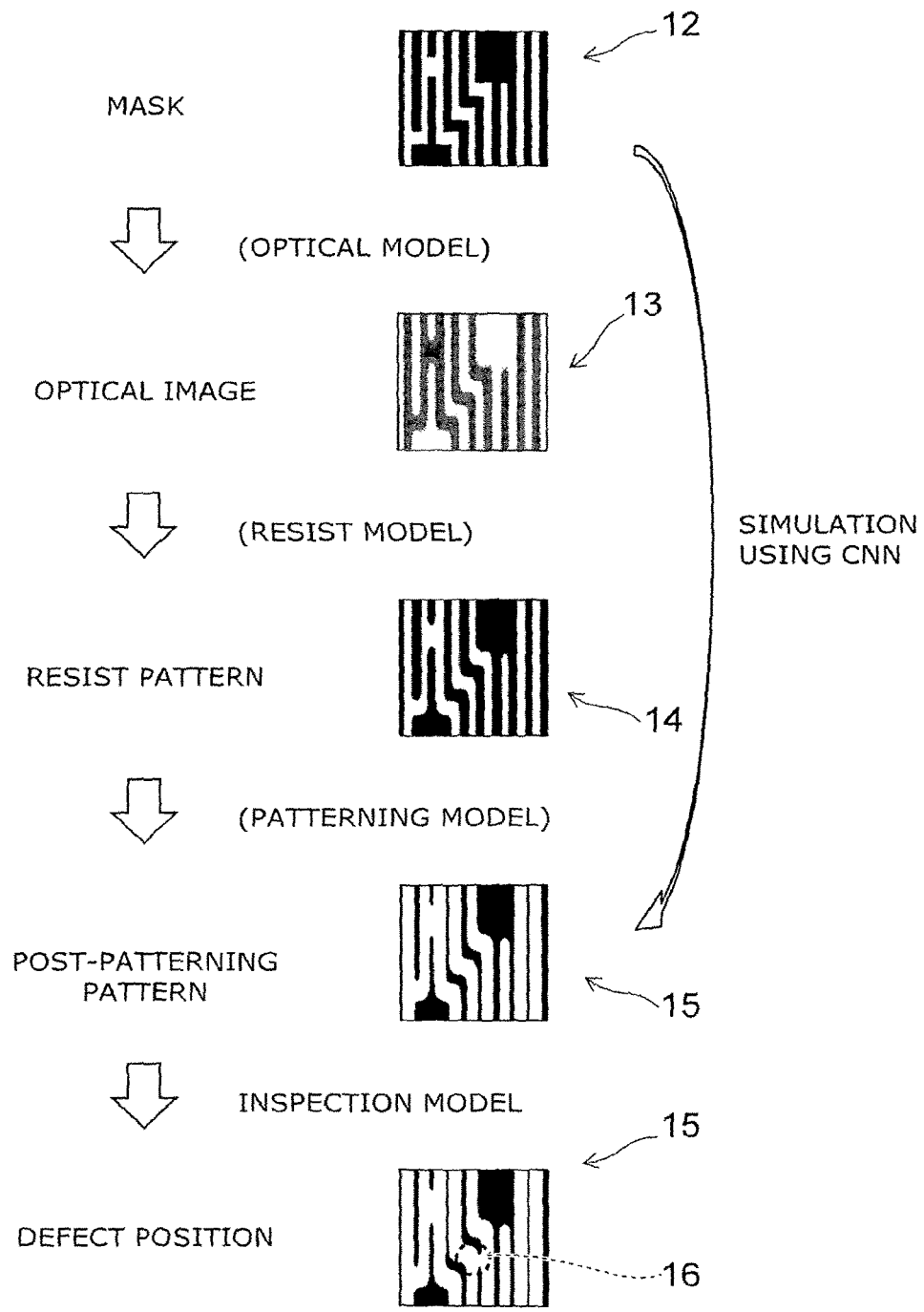
FIG. 13 is a drawing showing an evaluation method of a mask according to a fourth embodiment.

FIG. 13 is a drawing showing an evaluation method of the mask according to the embodiment.

Figure 14:
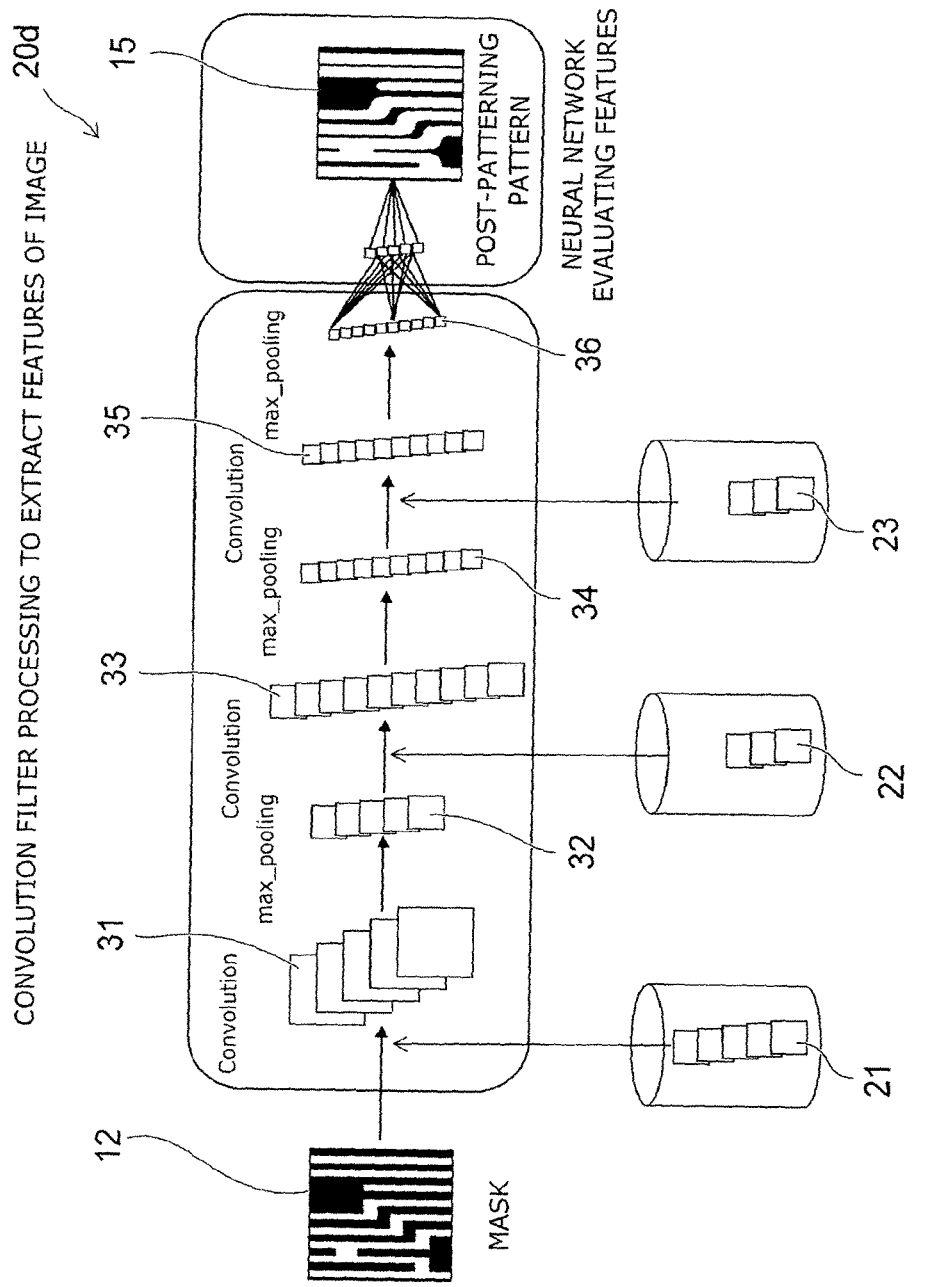
FIG. 14 is a drawing showing a method for calculating a post-patterning pattern according to the fourth embodiment.

FIG. 14 is a drawing showing a method for calculating the post-patterning pattern according to the embodiment.

In the mask evaluation system according to the embodiment as shown in FIG. 13, the post-patterning pattern 15 is simulated directly from the mask 12 without using the simulation of the optical image 13 using the optical model, the simulation of the resist pattern 14 using the resist model, and the simulation of the post-patterning pattern 15 using the patterning model.

In the embodiment as shown in FIG. 14, data representing the circuit pattern of the mask 12 is input to a CNN 20d; and the multiple reduced maps 36 are made. Then, the post-patterning pattern 15 is made by providing weighting to the multiple reduced maps 36 and synthesizing the multiple reduced maps 36 by the neural network. Thus, the post-patterning pattern 15 is estimated from the mask 12.

A method for making the CNN 20d according to the embodiment will now be described.

Figure 15:
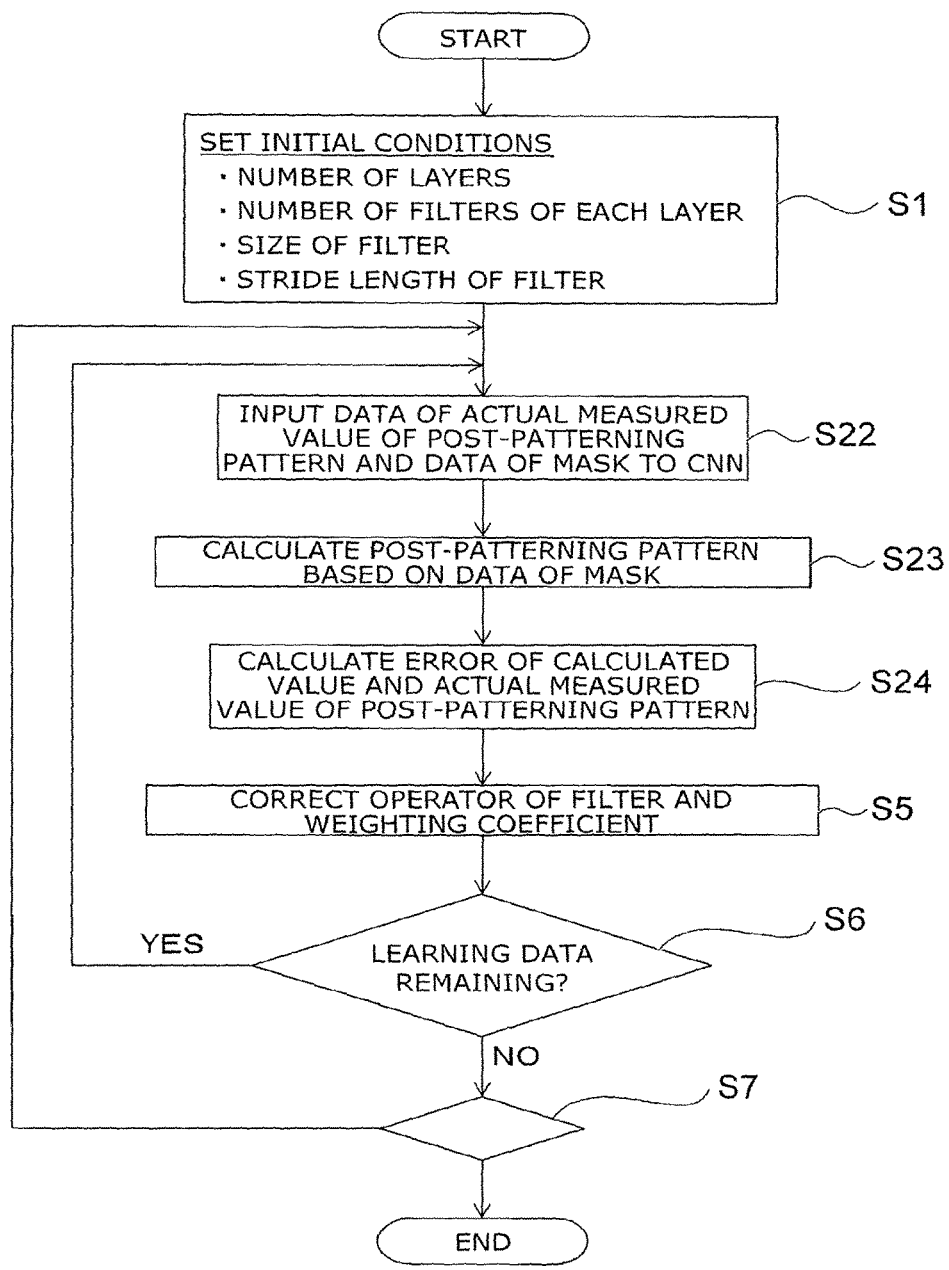
FIG. 15 is a flowchart showing a method for making a CNN according to the fourth embodiment.

FIG. 15 is a flowchart showing the method for making the CNN according to the embodiment.

As shown in step S1 of FIG. 15, first, the initial conditions are set. The items of the initial conditions are similar to those of the first embodiment described above.

Then, as shown in step S22, as the learning data, the data of the circuit pattern of the mask 12 and the actual measured value of the data of the post-patterning pattern 15 are input to the CNN 20d. The actual measured value of the data of the post-patterning pattern 15 is the measured and quantified configuration data of the post-patterning pattern 15 actually formed by forming the resist pattern 14 by exposing and developing the resist film 11 (referring to FIG. 3D) by using the mask 12 and by patterning the wafer 10 using the resist pattern 14 as a mask.

Then, as shown in step S23, the configuration of the post-patterning pattern 15 is calculated by the CNN 20d based on the data of the mask 12.

Then, as shown in step S24, the actual measured value and the calculated value of the post-patterning pattern 15 are compared; and the error between the actual measured value and the calculated value is calculated.

Then, as shown in step S5, the weighting coefficients l and k and the operators $e_{11}$ to $e_{55}$ of each filter and the offset component offset are corrected to reduce the error by back-propagation.

The subsequent processes are similar to those of the first embodiment described above. In other words, the weighting coefficients l and k and the operators $e_{11}$ to $e_{55}$ of each filter and the offset component offset are corrected based on many sets of learning data to reduce the error of the calculated value and the actual measured value of the threshold. Then, this process is repeated multiple times by using all of the learning data. Thereby, the CNN 20d is made.

Effects of the embodiment will now be described.

According to the embodiment, the post-patterning pattern 15 can be simulated directly based on the mask 12. Therefore, compared to the first embodiment described above, the simulation of the optical image 13 based on the optical model, the simulation of the resist pattern 14 based on the resist model, and the simulation of the post-patterning pattern 15 based on the patterning model can be omitted. Thereby, the design of the mask 12 can be more efficient.

Otherwise, the configuration, the calculation method, the method for making the CNN, and the effects of the embodiment are similar to those of the first embodiment described above.

Fifth Embodiment

A fifth embodiment will now be described.

Figure 16:
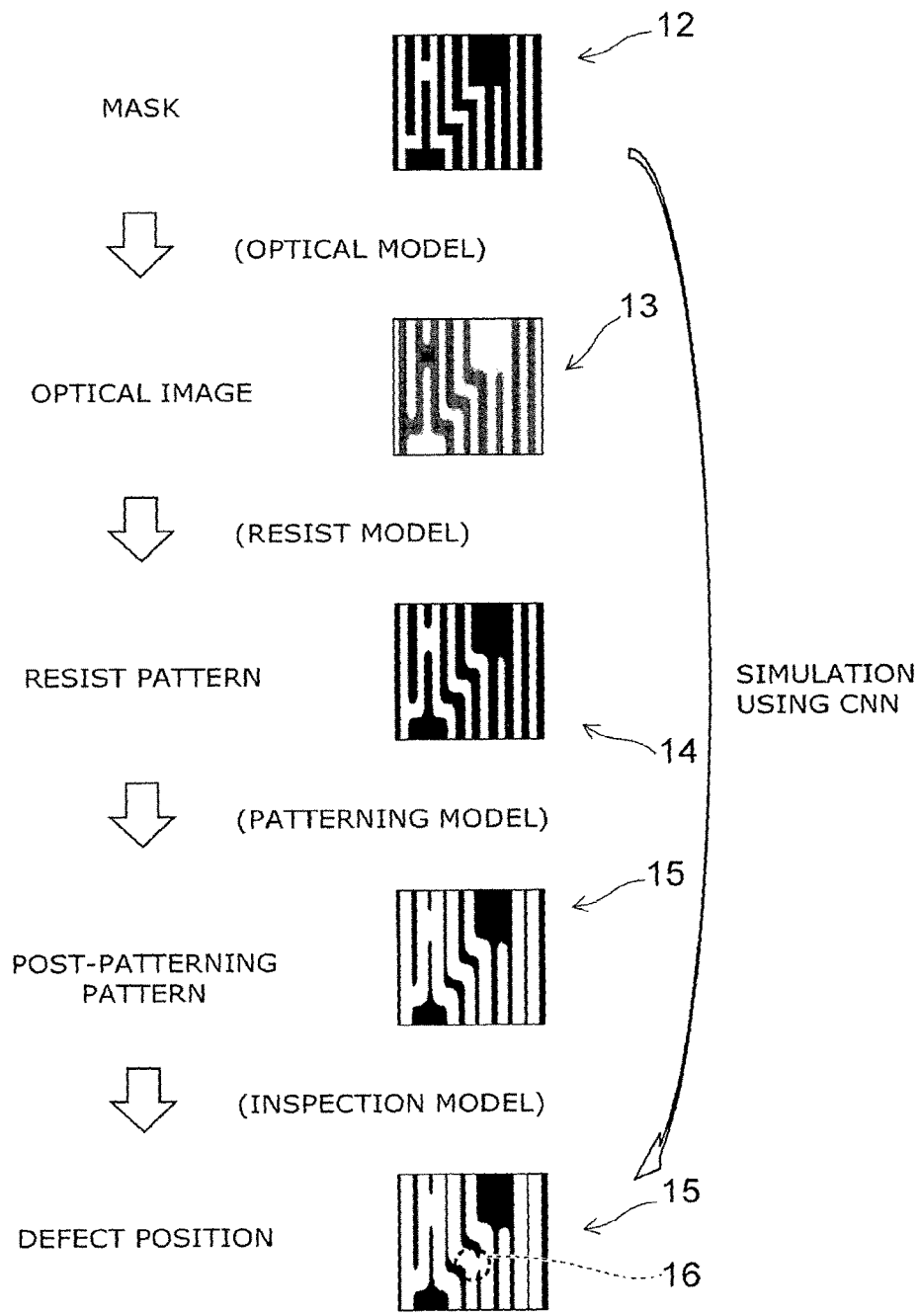
FIG. 16 is a drawing showing an evaluation method of a mask of a fifth embodiment.

FIG. 16 is a drawing showing an evaluation method of the mask of the embodiment.

Figure 17:
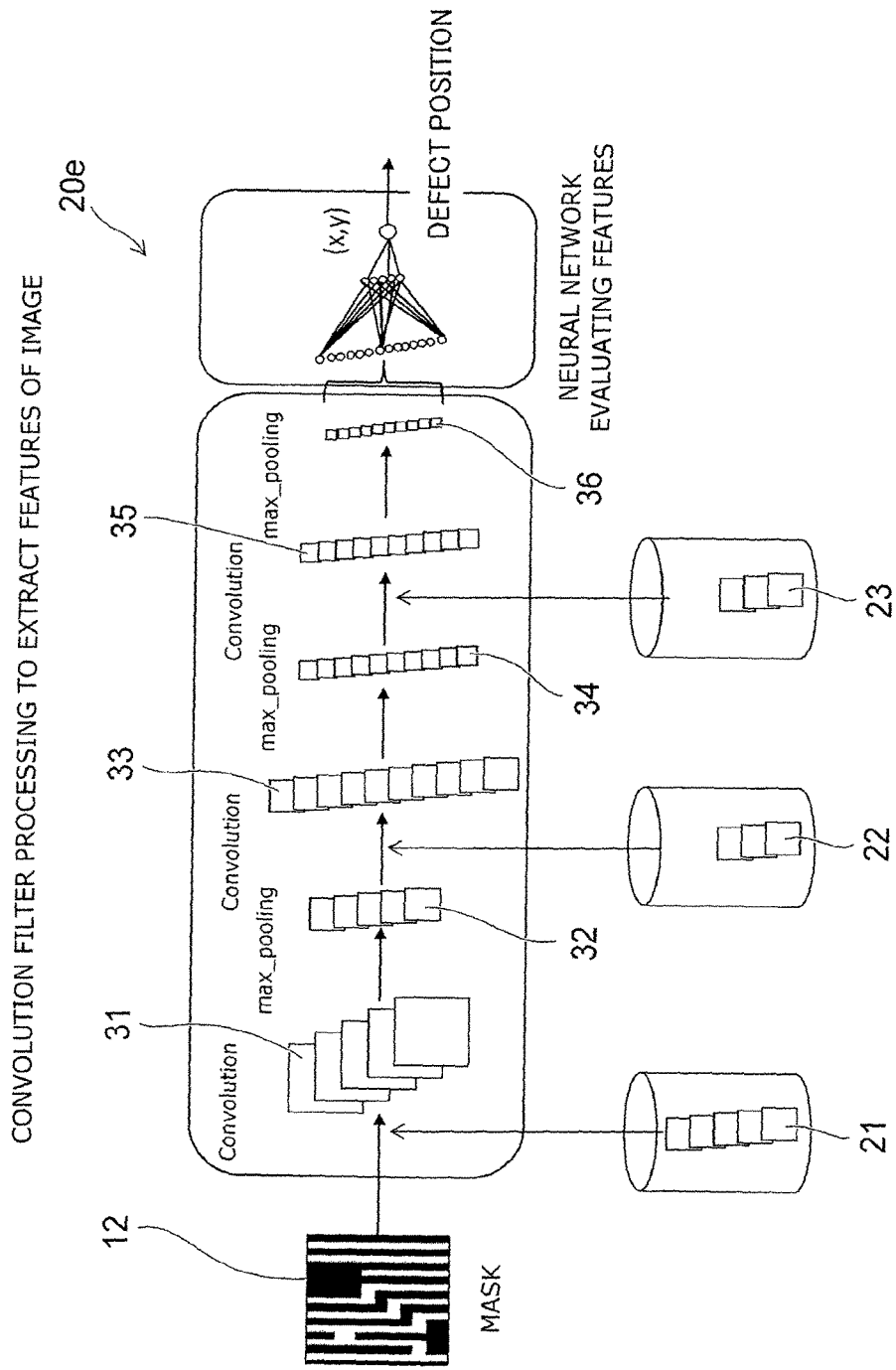
FIG. 17 is a drawing showing a method for calculating a defect position according to the fifth embodiment.

FIG. 17 is a drawing showing a method for calculating the defect position according to the embodiment.

In the mask evaluation system according to the embodiment as shown in FIG. 16, the existence or absence and the position of the defect 16 are simulated directly from the mask 12 without using the simulation of the optical image 13 using the optical model, the simulation of the resist pattern 14 using the resist model, the simulation of the post-patterning pattern 15 using the patterning model, and the simulation of the defect 16 using the inspection model.

In the embodiment as shown in FIG. 17, data representing the circuit pattern of the mask 12 is input to a CNN 20e; and the multiple reduced maps 36 are made by a method similar to that of the first embodiment described above. Then, the pixel values are extracted from the multiple reduced maps 36 by the neural network; and a collection of the numerical values is made. Then, similarly to the first embodiment described above, coordinates (x, y) representing the position of the defect 16 are generated from the collection of the numerical values by using the neural network. The coordinates are the position of the defect 16 in the post-patterning pattern 15. There are cases where the defect 16 is at one location; there are cases where the defect 16 is at multiple locations; and there are also cases where the defect 16 is not generated.

A method for making the CNN 20e according to the embodiment will now be described.

Figure 18:
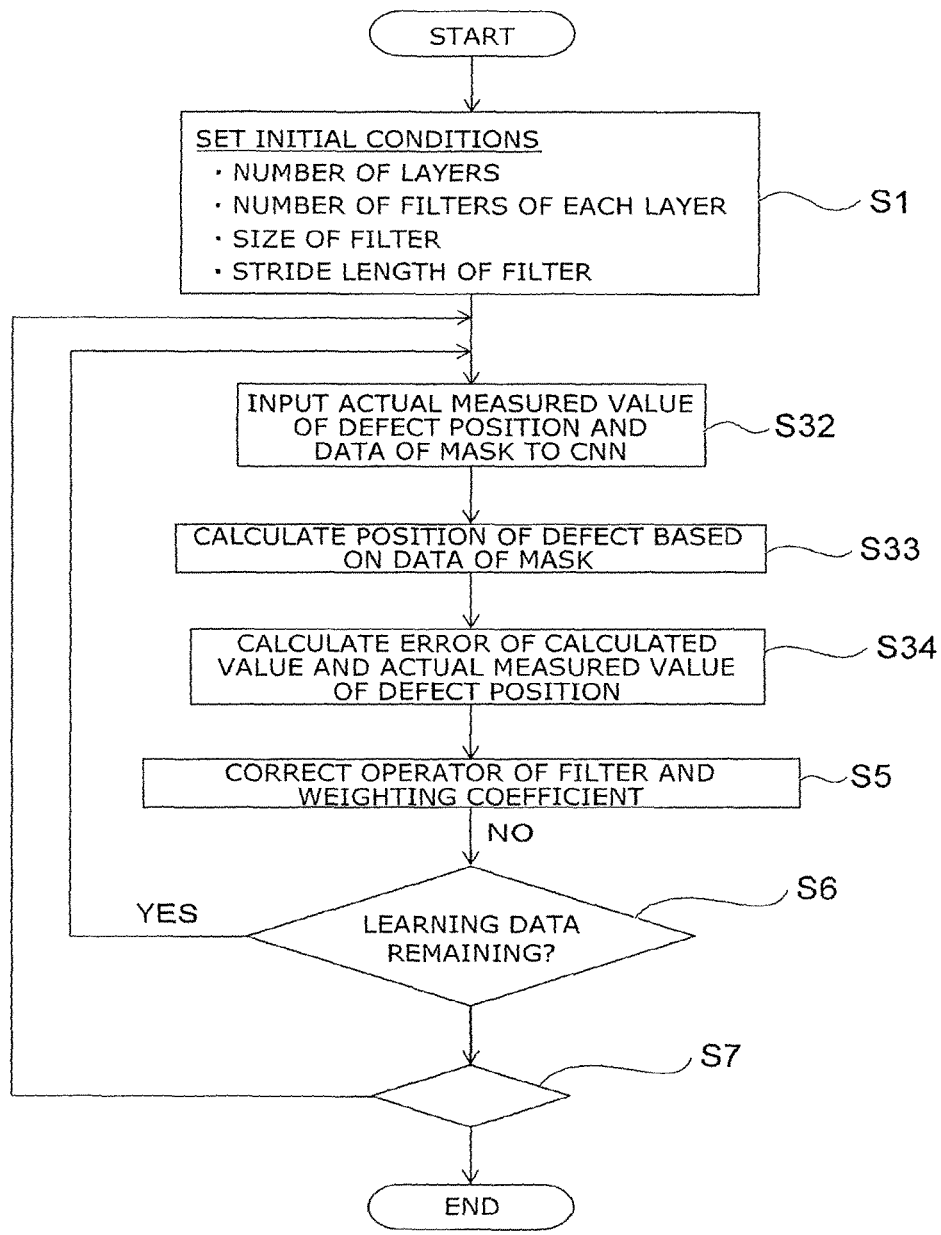
FIG. 18 is a flowchart showing a method for making a CNN according to the fifth embodiment.

FIG. 18 is a flowchart showing the method for making the CNN according to the embodiment.

As shown in step S1 of FIG. 18, first, the initial conditions are set. The items of the initial conditions are similar to those of the first embodiment described above.

Then, as shown in step S32, as the learning data, the data of the circuit pattern of the mask 12 and the actual measured value of the position of the defect 16 in the post-patterning pattern 15 are input to the CNN 20e. The actual measured value of the position of the defect 16 is acquired by actually forming the resist pattern 14 by using the mask 12, by forming the post-patterning pattern 15 by patterning the wafer 10 using the resist pattern 14 as a mask, and by detecting the defect 16 by inspecting the post-patterning pattern 15. At this time, it is favorable for the inspection conditions to be set to be as uniform as possible. For example, the defect 16 is detected by observing the post-patterning pattern 15 using one of an optical microscope or SEM.

Then, as shown in step S33, the position of the defect 16 is calculated based on the data of the mask 12.

Then, as shown in step S34, the actual measured value and the calculated value of the position of the defect 16 are compared; and the error between the actual measured value and the calculated value is calculated.

Then, as shown in step S5, the weighting coefficients l and k and the operators $e_{11}$ to $e_{55}$ of each filter and the offset component offset are corrected to reduce the error by backpropagation.

The subsequent processes are similar to those of the first embodiment described above. In other words, the weighting coefficients l and k and the operators $e_{11}$ to $e_{55}$ of each filter and the offset component offset are corrected based on many sets of learning data to reduce the error of the calculated value and the actual measured value of the threshold. Then, the correction is repeated multiple times. Thereby, the CNN 20e is made.

Effects of the embodiment will now be described.

According to the embodiment, the position of the defect 16 can be simulated directly based on the mask 12. Therefore, compared to the first embodiment described above, the simulation of the optical image 13 based on the optical model, the simulation of the resist pattern 14 based on the resist model, the simulation of the post-patterning pattern 15 based on the patterning model, and the simulation of the defect 16 based on the inspection model can be omitted. Thereby, the design of the mask 12 can be more efficient.

Otherwise, the configuration, the calculation method, the method for making the CNN, and the effects of the embodiment are similar to those of the first embodiment described above.

In the embodiment, the size of the defect 16 may be predicted in addition to the position of the defect 16. In such a case, the CNN 20e outputs a parameter representing the size of the defect 16 in addition to the position of the defect 16. For example, as such a parameter, the longitudinal and lateral length of the defect 16, the surface area of the defect 16, etc., are examples. On the other hand, in addition to the data of the mask 12 and the actual measured value of the position of the defect 16, the actual measured value of the parameter recited above also is included in the learning data of the CNN 20e. Only the size may be predicted without predicting the position of the defect 16.

Sixth Embodiment

Figures 19A, 19B:
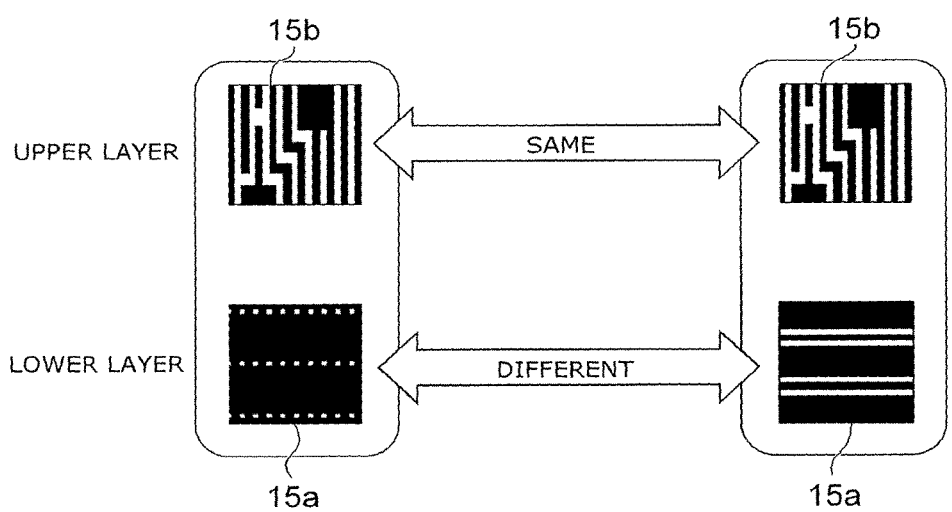
FIG. 19A and FIG. 19B are drawings showing a combination of a mask for forming a lower layer and a mask for forming an upper layer of a sixth embodiment.

A sixth embodiment will now be described FIG. 19A and FIG. 19B are drawings showing a combination of a mask for forming a lower layer and a mask for forming an upper layer of the embodiment.

Figure 20:
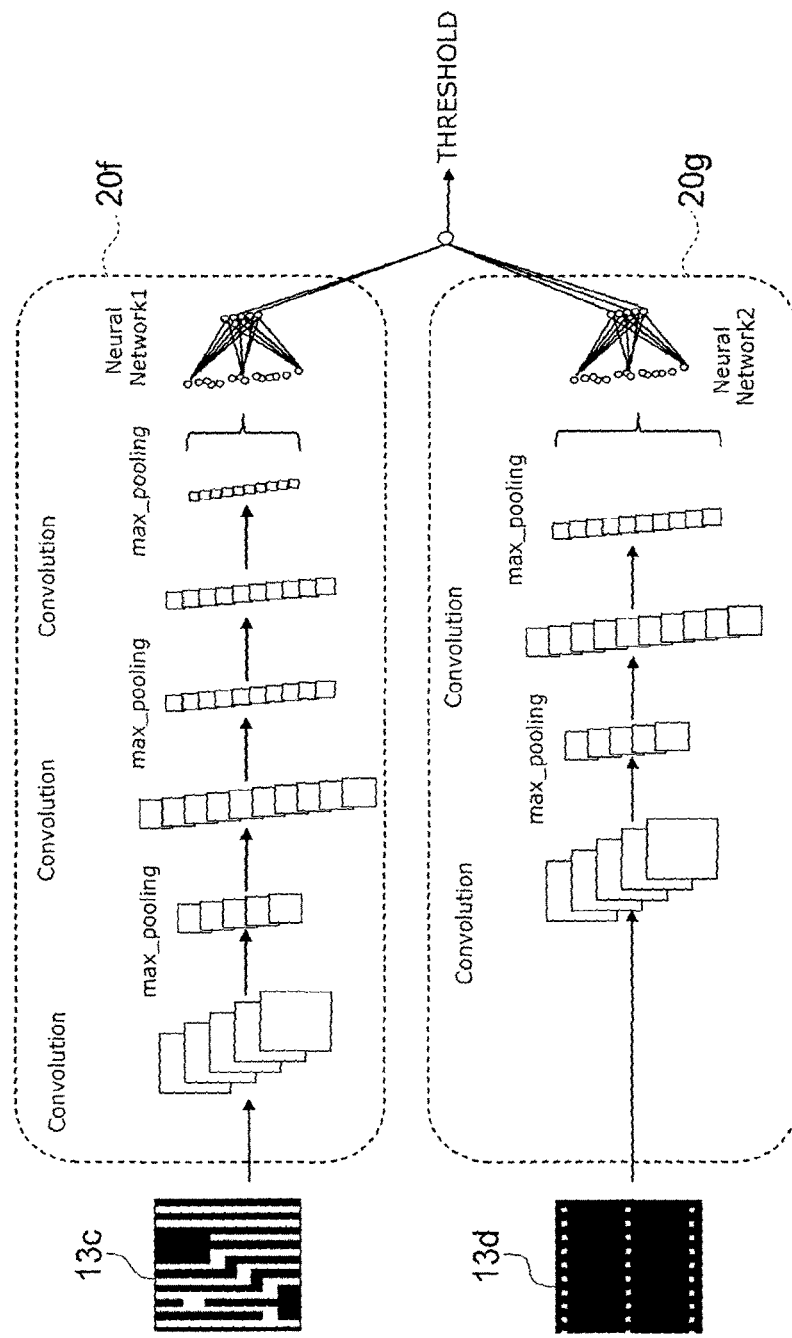
FIG. 20 is a drawing showing a method for calculating a threshold according to the sixth embodiment.

FIG. 20 is a drawing showing a method for calculating the threshold according to the embodiment.

As shown in FIG. 19A and FIG. 19B, the combination of the circuit pattern of the lower layer 15a and the circuit pattern of the upper layer 15b is different according to the integrated circuit device to be manufactured. Then, when forming the upper layer 15b, the circuit pattern of the lower layer 15a which is the foundation of the upper layer 15b affects the configuration of the upper layer 15b. In other words, even for the same circuit pattern of the upper layer 15b, there is a possibility that the configuration of the upper layer 15b that is formed may be different for different circuit patterns of the lower layer 15a. Therefore, in the embodiment, the threshold of the optical image of the upper layer 15b is calculated by also considering the circuit pattern of the lower layer 15a.

In the mask evaluation system according to the embodiment as shown in FIG. 20, the computer 200 (referring to FIG. 4) realizes a CNN 20f and a CNN 20g. The output of the CNN 20f and the output of the CNN 20g ultimately are integrated and are output as one threshold. The output of the CNN 20f and the output of the CNN 20g may be integrated by a neural network.

An image 13c of the upper layer is input to the CNN 20f as the input image. An image 13d of the lower layer is input to the CNN 20g as the input image. In such a case, the upper layer is a layer formed by the mask 12 which is to be evaluated. Also, the lower layer is formed before the upper layer and is a layer used as the foundation of the upper layer. Hereinafter, the mask for forming the lower layer also is called the "preceding mask."

The image 13c of the upper layer is data representing the circuit pattern of the mask 12, or data of the optical image 13 formed by the mask 12. On the other hand, the image 13d of the lower layer is data representing the circuit pattern of the preceding mask, data of the optical image formed by the preceding mask, data of the resist pattern, or data of the post-patterning pattern.

The CNNs 20f and 20g calculate and output the threshold of the optical image 13 formed by the mask 12 based on the image 13c of the upper layer and the image 13d of the lower layer. Also, machine learning of the filters and the weighting coefficients of the CNNs 20f and 20g is performed using the image 13c of the upper layer, the image 13d of the lower layer, and the actual measured value of the threshold of the optical image 13 when forming the upper layer.

According to the embodiment, an evaluation having higher precision is possible because the configuration of the lower layer used as the foundation is considered when evaluating the mask 12 of the upper layer.

Otherwise, the configuration, the calculation method, the method for making the CNN, and the effects of the embodiment are similar to those of the second embodiment described above.

Although an example is shown in the embodiment in which the threshold of the optical image 13 of the upper layer is calculated, this is not limited thereto; and the resist pattern 14, the post-patterning pattern 15, or the position or size of the defect 16 of the upper layer may be calculated.

Modification of Sixth Embodiment

A modification of the sixth embodiment will now be described.

Figure 21:
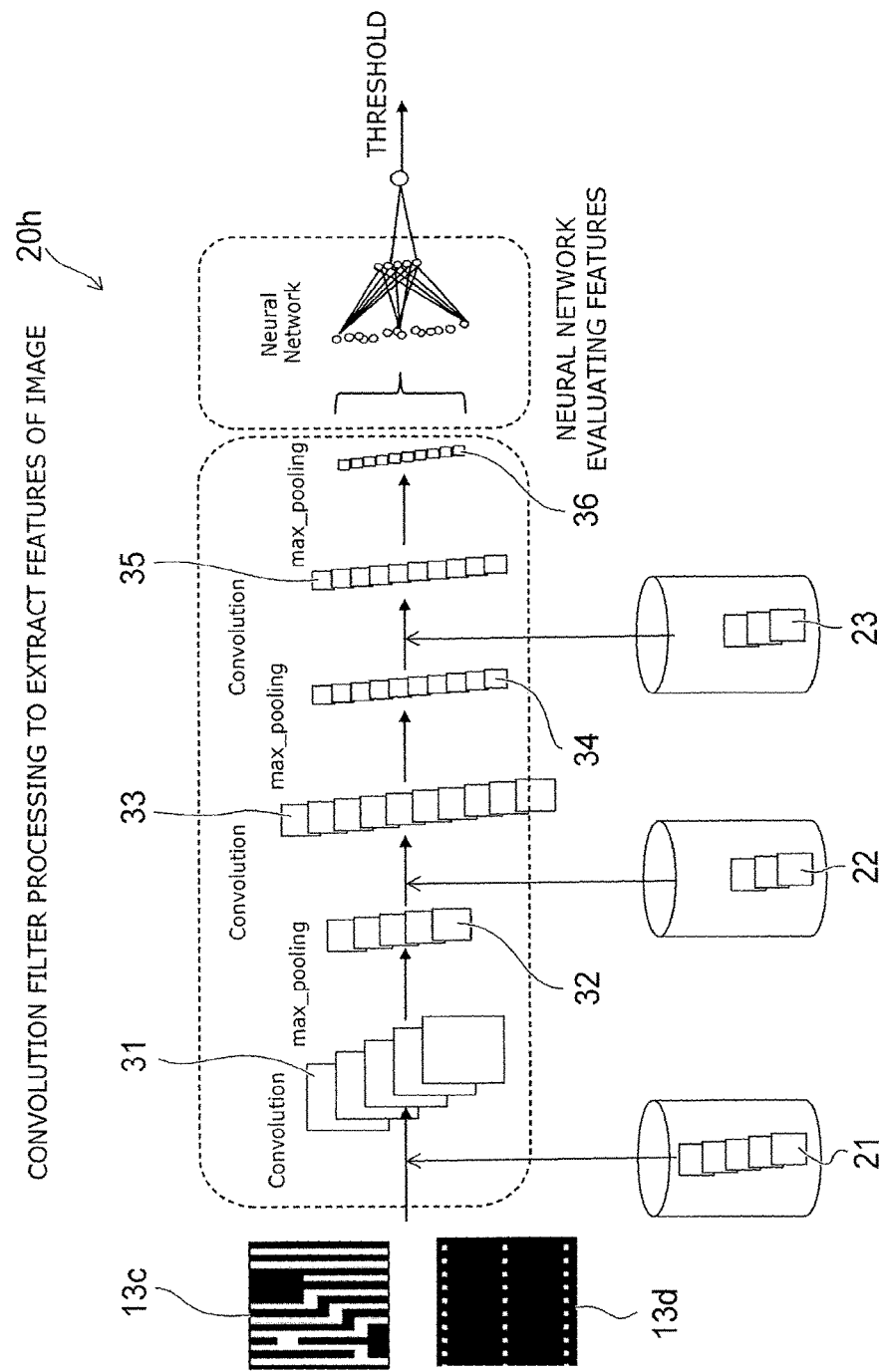
FIG. 21 is a drawing showing a method for calculating a threshold according to a modification of the sixth embodiment.

FIG. 21 is a drawing showing a method for calculating the threshold according to the modification.

In the modification as shown in FIG. 21, both the image 13c of the upper layer and the image 13d of the lower layer are input to a single CNN 20h; and the threshold of the optical image 13 when forming the upper layer is calculated. The threshold can be calculated in this way as well.

Otherwise, the configuration, the calculation method, the method for making the CNN, and the effects of the modification are similar to those of the sixth embodiment described above.

Seventh Embodiment

A seventh embodiment will now be described.

The embodiment is an example in which the CNN 20d according to the fourth embodiment and the CNN 20e according to the fifth embodiment described above are mounted in an inspection apparatus of the post-patterning pattern 15.

Figure 22:
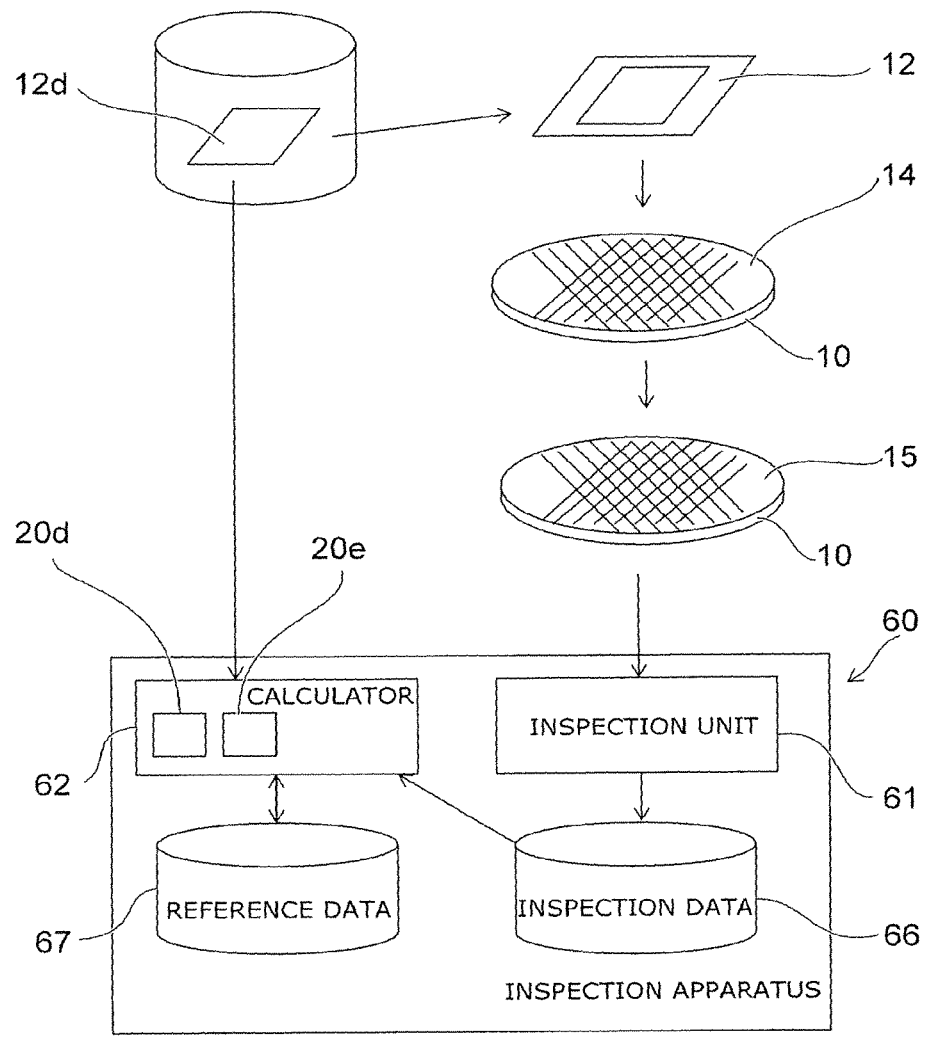
FIG. 22 is a block diagram showing an inspection apparatus according to a seventh embodiment.

FIG. 22 is a block diagram showing the inspection apparatus according to the embodiment.

As shown in FIG. 22, an inspection unit 61 and a calculator 62 are provided in an inspection apparatus 60 according to the embodiment. An observation unit such as, for example, an optical microscope, SEM, or the like is provided in the inspection unit 61; and the post-patterning pattern 15 that is formed on the wafer 10 is inspected. Generally, because the resolution of an optical microscope is lower than the resolution of SEM, the defect 16 itself is not imaged in the optical microscope; and the defect 16 often is detected as a fluctuation of bright and dark. The CNN 20d and the CNN 20e are stored in the calculator 62.

In the embodiment, the mask 12 is made based on design data 12d of the mask 12. Then, the resist pattern 14 is formed on the wafer 10 by exposing and developing the resist film by using the mask 12. Then, the post-patterning pattern 15 is formed by performing etching of the wafer 10 using the resist pattern 14 as a mask. Then, the post-patterning pattern 15 is placed into the inspection unit 61 of the inspection apparatus 60 and inspected. Thereby, inspection data 66 is acquired. Data representing the configuration of the post-patterning pattern 15 and the coordinate data of the defect 16 is included in the inspection data 66.

On the other hand, the design data 12d of the mask 12 is input to the calculator 62 of the inspection apparatus 60. Thereby, the calculator 62 executes the CNN 20d and calculates the post-patterning pattern 15. Also, the CNN 20e is executed; and the position of the defect 16 is calculated. Thereby, reference data 67 that represents the post-patterning pattern 15 and the defect 16 is made.

Then, the post-patterning pattern 15 that is actually manufactured is inspected by the inspection data 66 and the reference data 67 being compared by the calculator 62. For example, because the information of the defect 16 originating in the design of the mask 12 is included in the reference data 67, a guess can be made about the position of the defect 16 originating in the design of the mask 12 before the inspection. Also, because information of defects not originating in the design of the mask 12 is not included in the reference data 67, the detection of such defects is easy by making a differential image of the inspection data 66 and the reference data 67. Also, in the case where an optical microscope is provided in the inspection unit 61, it can be discriminated whether the fluctuation of bright and dark occurring in the inspection data 66 is caused by the defect 16 or is simply noise.

Effects of the embodiment will now be described.

According to the embodiment, the efficiency and the precision of the inspection of the post-patterning pattern 15 actually formed can be increased by mounting the CNN 20d and the CNN 20e in the inspection apparatus of the post-patterning pattern 15 and by predicting the configuration of the post-patterning pattern 15 and the position of the defect 16.

Only one of the CNN 20d or the CNN 20e may be stored in the calculator 62; and only one of the post-patterning pattern 15 or the defect 16 may be simulated.

The embodiments described above can be implemented in combination with each other. For example, in the third to fifth embodiments, similarly to the second embodiment, multiple types of data having mutually-different resolutions may be generated as the data of the mask 12. For example, first data representing the configuration of a first portion of the mask 12 may be input; and second data having a resolution lower than that of the first data and representing the configuration of a second portion that includes the first portion and is wider than the first portion may be input. Thereby, similarly to the second embodiment, the precision of the simulation can be increased. Also, in the third to sixth embodiments, similarly to the first embodiment, the data of the optical image 13 may be input instead of the data of the mask 12. Further, in the third to seventh embodiments, the data of the optical image and the data representing the configuration of the mask may be input.

According to the embodiments described above, a non-transitory computer readable storage medium storing a mask evaluation program, a mask evaluation method, and an inspection apparatus having high precision can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A non-transitory computer readable storage medium storing a design support program supporting design of an integrated circuit device,
the design support program:
causing a computer to output a calculated value of second data when first data is input, the first data corresponding to a circuit pattern of a mask used to manufacture the integrated circuit device, the second data corresponding to a two-dimensional shape of a pattern formed on a semiconductor substrate by the mask, and
causing the computer to perform a display of an evaluation result based on at least one of: the first data; the second data,
the design support program using a convolutional neural network in the outputting, the convolutional neural network including a filter and a weighting coefficient learned to reduce an error of the calculated value of the second data and an actual measured value of the second data.

2. The medium according to claim 1, wherein
the first data is data of an optical image formed on a resist film by the mask corresponding to the circuit pattern, and
the second data is a threshold of a light intensity of the optical image discriminating whether a portion of the resist film remains or is removed when exposing the resist film by the optical image and developing the resist film.

3. The medium according to claim 1, wherein
the first data is data representing a shape of the mask corresponding to the circuit pattern, and
the second data is data representing a configuration of a resist pattern formed by exposing a resist film by using the mask and developing the resist film.

4. The medium according to claim 1, wherein
the first data is data representing a shape of the mask corresponding to the circuit pattern, and
the second data is data representing a configuration of a post-patterning pattern formed by etching a patterning material by using a resist pattern, the resist pattern is formed by exposing a resist film by using the mask and developing the resist film.

5. The medium according to claim 1, wherein
the first data is data representing a shape of the mask corresponding to the circuit pattern, and the second data is data representing a position or size of a defect in a post-patterning pattern, the post-patterning pattern is formed by etching a patterning material by using a resist pattern, the resist pattern is formed by exposing a resist film by using the mask and developing the resist film.

6. The medium according to claim 1, wherein the first data includes data of a plurality of input images.

7. The medium according to claim 6, wherein the plurality of input images has mutually-different resolutions.

8. The medium according to claim 6, wherein the plurality of input images includes an image of the mask corresponding to the circuit pattern, and an optical image formed on a resist film by the mask.

9. The medium according to claim 1, wherein
the first data includes:
data representing a shape of the mask corresponding to the circuit pattern, or data of an optical image formed on a resist film by the mask; and
data corresponding to a foundation pattern formed in a patterning material,
the second data is a threshold of a light intensity of the optical image discriminating whether a portion of the resist film remains or is removed when exposing the resist film by the optical image and developing the resist film, data representing a configuration of a resist pattern formed by exposing the resist film by using the mask and developing the resist film, data representing a configuration of a post-patterning pattern formed by etching the patterning material by using the resist pattern, or data representing a position or size of a defect in the post-patterning pattern.

10. The medium according to claim 9, wherein the data corresponding to the foundation pattern is data representing a circuit pattern of a preceding mask used to form the foundation pattern, or data of the optical image formed on the resist film by the preceding mask.

11. An inspection apparatus, comprising:
a calculator outputting a calculated value of a post-patterning pattern or of a position or size of a defect in a post-patterning pattern when data representing the circuit pattern of a mask is input, the post-patterning pattern being formed by etching a patterning material by using a resist pattern, the resist pattern being formed by exposing a resist film by using the mask and developing the resist film, the calculator realizing a convolutional neural network, the convolutional neural network having a filter and a weighting coefficient learned to reduce an error of the calculated value and an actual measured value of the post-patterning pattern or of the position or size of the defect using the data and the actual measured value to; and
an inspection unit inspecting a post-patterning pattern formed by etching a patterning material by using a resist pattern, the resist pattern being formed by exposing a resist film by using the mask and developing the resist film.

12. The apparatus according to claim 11, wherein the calculator compares the calculated value and an inspection result of the post-patterning pattern.

13. A design support method supporting design of an integrated circuit device,
the method comprising:
calculating a calculated value of second data by inputting first data to a convolutional neural network, the first data corresponding to a circuit pattern of a mask used to manufacture the integrated circuit device, the second data corresponding to a two-dimensional shape of a pattern formed on a semiconductor substrate by the mask, and
performing a display of an evaluation result based on at least one of: the first data; the second data,
the convolutional neural network including a filter and a weighting coefficient learned to reduce an error of the calculated value of the second data and an actual measured value of the second data.

14. The method according to claim 13, wherein
the first data is data of an optical image formed on a resist film by the mask corresponding to the circuit pattern, and
the second data is a threshold of a light intensity of the optical image discriminating whether a portion of the resist film remains or is removed when exposing the resist film by the optical image and developing the resist film.

15. The method according to claim 13, wherein
the first data is data representing a shape of the mask corresponding to the circuit pattern, and
the second data is data representing a configuration of a resist pattern formed by exposing a resist film by using the mask and developing the resist film.

16. The method according to claim 13, wherein
the first data is data representing a shape of the mask corresponding to the circuit pattern, and
the second data is data representing a configuration of a post-patterning pattern formed by etching a patterning material by using a resist pattern, the resist pattern is formed by exposing a resist film by using the mask and developing the resist film.

17. The method according to claim 13, wherein the first data includes data of a plurality of input images.

18. The method according to claim 17, wherein the plurality of input images has mutually-different resolutions.

19. The method according to claim 17, wherein the plurality of input images includes an image of the mask corresponding to the circuit pattern, and an optical image formed on a resist film by the mask.

20. The method according to claim 13, wherein
the first data includes:
data representing a shape of the mask corresponding to the circuit pattern, or data of an optical image formed on a resist film by the mask; and
data corresponding to a foundation pattern formed in a patterning material,
the second data is a threshold of a light intensity of the optical image discriminating whether a portion of the resist film remains or is removed when exposing the resist film by the optical image and developing the resist film, data representing a configuration of a resist pattern formed by exposing the resist film by using the mask and developing the resist film, data representing a configuration of a post-patterning pattern formed by etching the patterning material by using the resist pattern, or data representing a position or size of a defect in the post-patterning pattern.

* * * * *